United States Patent
Tsuchihashi et al.

(10) Patent No.: US 10,890,847 B2
(45) Date of Patent: Jan. 12, 2021

(54) PATTERN FORMING METHOD, RESIST PATTERN, METHOD FOR MANUFACTURING ELECTRONIC DEVICE, AND ELECTRONIC DEVICE

(71) Applicant: FUJIFILM Corporation, Tokyo (JP)

(72) Inventors: Toru Tsuchihashi, Haibara-gun (JP); Wataru Nihashi, Haibara-gun (JP); Hideaki Tsubaki, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/358,537

(22) Filed: Nov. 22, 2016

(65) Prior Publication Data

US 2017/0075222 A1    Mar. 16, 2017

Related U.S. Application Data

(63) Continuation of application No. PCT/JP2015/063709, filed on May 13, 2015.

(30) Foreign Application Priority Data

Jul. 31, 2014 (JP) ................................. 2014-155946

(51) Int. Cl.
| | | |
|---|---|---|
| G03F 7/20 | (2006.01) | |
| G03F 7/32 | (2006.01) | |
| G03F 7/038 | (2006.01) | |
| G03F 7/039 | (2006.01) | |
| C08F 220/18 | (2006.01) | |
| G03F 7/004 | (2006.01) | |
| G03F 7/16 | (2006.01) | |
| G03F 7/40 | (2006.01) | |
| C08F 220/20 | (2006.01) | |
| C08F 220/34 | (2006.01) | |
| C08F 12/22 | (2006.01) | |
| C08F 12/24 | (2006.01) | |
| C08F 212/14 | (2006.01) | |
| C08F 220/30 | (2006.01) | |
| C08F 220/38 | (2006.01) | |

(52) U.S. Cl.
CPC .......... *G03F 7/325* (2013.01); *C08F 220/18* (2013.01); *G03F 7/0045* (2013.01); *G03F 7/038* (2013.01); *G03F 7/039* (2013.01); *G03F 7/0392* (2013.01); *G03F 7/0397* (2013.01); *G03F 7/16* (2013.01); *G03F 7/168* (2013.01); *G03F 7/2004* (2013.01); *G03F 7/2037* (2013.01); *G03F 7/2059* (2013.01); *G03F 7/32* (2013.01); *G03F 7/40* (2013.01); *C08F 12/22* (2013.01); *C08F 12/24* (2013.01); *C08F 212/14* (2013.01); *C08F 220/1803* (2020.02); *C08F 220/1806* (2020.02); *C08F 220/20* (2013.01); *C08F 220/302* (2020.02); *C08F 220/34* (2013.01); *C08F 220/382* (2020.02); *C08F 2800/10* (2013.01)

(58) Field of Classification Search
CPC ........... G03F 7/325; G03F 7/30; G03F 7/2059
USPC ........................................ 430/326, 331, 296
See application file for complete search history.

(56) References Cited

U.S. PATENT DOCUMENTS

| | | | | |
|---|---|---|---|---|
| 8,980,536 | B2 * | 3/2015 | Bae ....................... | G03F 7/325 430/325 |
| 2011/0177462 | A1 | 7/2011 | Hatakeyama et al. | |
| 2012/0009529 | A1 * | 1/2012 | Hatakeyama ......... | G03F 7/0397 430/325 |
| 2012/0135349 | A1 * | 5/2012 | Hatakeyama ......... | C08F 220/18 430/283.1 |
| 2012/0219755 | A1 * | 8/2012 | Bae ....................... | G03F 7/325 428/141 |
| 2013/0045440 | A1 * | 2/2013 | Tsuchihashi ........... | C08F 12/24 430/5 |
| 2013/0337383 | A1 | 12/2013 | Hatakeyama et al. | |
| 2014/0011136 | A1 | 1/2014 | Hatakeyama et al. | |
| 2014/0178820 | A1 * | 6/2014 | Hatakeyama ....... | C08F 214/186 430/285.1 |
| 2014/0212811 | A1 | 7/2014 | Inoue et al. | |
| 2014/0234762 | A1 | 8/2014 | Yamaguchi | |
| 2015/0093692 | A1 | 4/2015 | Yamaguchi | |
| 2015/0118627 | A1 * | 4/2015 | Yamamoto ............ | G03F 7/0035 430/325 |

(Continued)

FOREIGN PATENT DOCUMENTS

| | | |
|---|---|---|
| JP | 2011-170316 A | 9/2011 |
| JP | 2013-080006 A | 5/2013 |

(Continued)

OTHER PUBLICATIONS

International Search Report for PCT/JP2015/063709 dated Aug. 11, 2015 [PCT/ISA/210].

(Continued)

*Primary Examiner* — John S Chu
(74) *Attorney, Agent, or Firm* — Sughrue Mion, PLLC

(57) ABSTRACT

A pattern forming method includes, in this order, forming a film on a substrate, using an active-light-sensitive or radiation-sensitive resin composition containing a resin (A) which has a repeating unit having a phenolic hydroxyl group, and a repeating unit having a group that decomposes by the action of an acid to generate a carboxyl group, and a compound (B) that generates an acid upon irradiation with active light or radiation; exposing the film; and developing the exposed film using a developer including an organic solvent, in which the developer including an organic solvent contains an organic solvent having 8 or more carbon atoms and 2 or less heteroatoms in the amount of 50% by mass or more.

13 Claims, No Drawings

(56) References Cited

U.S. PATENT DOCUMENTS

2015/0140484 A1   5/2015   Takizawa et al.
2015/0168834 A1   6/2015   Takizawa et al.

FOREIGN PATENT DOCUMENTS

| | | |
|---|---|---|
| JP | 2013-101270 A | 5/2013 |
| JP | 2013-257468 A | 12/2013 |
| JP | 2014-016440 A | 1/2014 |
| JP | 2014-026265 A | 2/2014 |
| JP | 2014-041327 A | 3/2014 |
| JP | 2014-059543 A | 4/2014 |
| JP | 2014-106298 A | 6/2014 |
| JP | 2014106298 a  * | 6/2014 |
| TW | 201418874 A | 5/2014 |

OTHER PUBLICATIONS

Written Opinion for PCT/JP2015/063709 dated Aug. 11, 2015 [PCT/ISA/237].

International Preliminary Report on Patentability and Written Opinion, dated Jan. 31, 2017, in corresponding International Application No. PCT/JP2015/063709, 11 pages in English and Japanese.

Office Action dated Oct. 1, 2017 issued by the Korean Intellectual Property Office in counterpart Korean Application No. 10-2016-7032481.

Office Action dated Dec. 12, 2017, from the Japanese Patent Office in counterpart Japanese Application No. 2016-538176.

Office Action dated Jul. 5, 2018, issued in corresponding Taiwanese Application No. 104115982, 10 pages in Chinese and English.

* cited by examiner

PATTERN FORMING METHOD, RESIST PATTERN, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2015/63709, filed on May 13, 2015, which claims priority under 35 U.S.C. §119(a) to Japanese Patent Application No. 2014-155946, filed on Jul. 31, 2014. Each of the above application(s) is hereby expressly incorporated by reference, in its entirety, into the present application.

BACKGROUND OF THE INVENTION

1. Field of the Invention

The present invention relates to a pattern forming method using an active-light-sensitive or radiation-sensitive resin composition (resist composition), a resist pattern formed by the pattern forming method, a method for manufacturing an electronic device including the pattern forming method, and an electronic device manufactured by the manufacturing method.

More specifically, the present invention relates to a pattern forming method which is used for a process for manufacturing a semiconductor such as an IC, a process for manufacturing a circuit board for a liquid crystal, a thermal head, or the like, and other lithographic processes for photofabrication, a resist pattern formed by the pattern forming method, a method for manufacturing an electronic device including the pattern forming method, and an electronic device manufactured by the manufacturing method.

2. Description of the Related Art

Since a resist for a KrF excimer laser (248 nm) was developed, a pattern forming method using chemical amplification has been used in order to compensate for desensitization caused by light absorption.

For example, in a positive type chemical amplification method, a photoacid generator included in an exposed area first decomposes by light irradiation to generate an acid. Further, in a post exposure bake (PEB) process or the like, a catalytic action of the generated acid allows an alkali-insoluble group included in a photosensitive composition to be changed into an alkali-soluble group. Thereafter, development is carried out using, for example, an alkali solution. Thus, the exposed area is removed to obtain a desired pattern.

As integrated circuits have been highly integrated, precision processing using a resist composition has been required, particularly to form ultrafine patterns in a size of particularly 30 nm or less. If the pattern size becomes such an ultrafine size, swelling phenomenon in which a developer makes a resist pattern swell becomes problematic in a developing step. The linearity of the resist pattern decreases by swelling, or collapse of the resist pattern occurs in a rinsing treatment after development, and thus, the resolution is reduced.

In recent years, a pattern forming method using a developer including an organic solvent has also been developed (see, for example, JP2013-101270A). For example, JP2013-101270A discloses a pattern forming method including a step of coating a resist composition of which the solubility in an alkali developer is enhanced and the solubility in an organic solvent developer is reduced upon irradiation with active light or radiation onto a substrate, an exposing step, and a step of carrying out development using an organic solvent developer.

SUMMARY OF THE INVENTION

In recent years, in order to manufacture an electronic device with high integration as well as high precision, there is a demand for a method for stably forming a fine pattern with high precision (for example, 30 nm or less).

The present inventors have investigated the pattern forming method described in JP2013-101270A, and as a result, have found that the sensitivity, the resolving performance, and the pattern shape can further be improved.

The present invention has been made, taking into consideration the above aspects, and thus, it has an object to provide a pattern forming method by which the sensitivity, the resolving performance, and the pattern shape are excellent, a resist pattern formed by the pattern forming method, a method for manufacturing an electronic device including the pattern forming method, and an electronic device manufactured by the manufacturing method.

The present inventors have made intensive studies, and as a result, have found that the above objects can be accomplished by the following configurations.

That is, the present invention provides [1] to [9] below.

[1] A pattern forming method comprising, in this order, (1) forming a film on a substrate, using an active-light-sensitive or radiation-sensitive resin composition containing a resin (A) which has a repeating unit having a phenolic hydroxyl group, and a repeating unit having a group that decomposes by the action of an acid to generate a carboxyl group, and a compound (B) that generates an acid upon irradiation with active light or radiation; (2) exposing the film; and (4) developing the exposed film using a developer including an organic solvent, in which the developer including an organic solvent contains an organic solvent having 8 or more carbon atoms and 2 or less heteroatoms in the amount of 50% by mass or more.

[2] The pattern forming method as described in [1], in which the repeating unit having a phenolic hydroxyl group is a repeating unit represented by General Formula (p1) which will be described later.

[3] The pattern forming method as described in [1] or [2], in which the developer including an organic solvent contains an ester-based organic solvent having 8 or more carbon atoms and 2 or less heteroatoms in the amount of 50% by mass or more.

[4] The pattern forming method as described in [3], in which the developer including an organic solvent is a developer containing an ester-based solvent having a structure represented by General Formula (S) which will be described later.

[5] The pattern forming method as described in any one of [1] to [4], in which the resin (A) further has a repeating unit having a lactone group.

[6] The pattern forming method as described in any one of [1] to [5], in which the exposure is carried out using electron beams or EUV light.

[7] A resist pattern formed by the pattern forming method as described in any one of [1] to [6].

[8] A method for manufacturing an electronic device, comprising the pattern forming method as described in any one of [1] to [6].

[9] An electronic device manufactured by the method for manufacturing an electronic device as described in [8].

According to the present invention, it is possible to provide a pattern forming method, by which the sensitivity, the resolving performance, and the pattern shape are excellent, a resist pattern formed by the pattern forming method, a method for manufacturing an electronic device including the pattern forming method, and an electronic device manufactured by the manufacturing method.

DESCRIPTION OF THE PREFERRED EMBODIMENTS

Hereinafter, details for carrying out the present invention will be specifically described.

In the present invention, "active light" or "radiation" means, for example, a bright line spectrum of a mercury lamp, far ultraviolet rays represented by an excimer laser, extreme ultraviolet rays (EUV light), X-rays, electron beams, or the like. In addition, in the present invention, "light" means active light or radiation. Unless otherwise specified, "exposure" in the present specification includes not only exposure by a bright line spectrum of a mercury lamp, far ultraviolet rays represented by an excimer laser, X-rays, EUV light, or the like, but also writing by particle rays such as electron beams and ion beams.

Incidentally, in citations for a group (atomic group) in the present specification, a group which is denoted without specifying whether it is substituted or unsubstituted encompasses both a group not having a substituent and a group having a substituent. For example, an "alkyl group" includes not only an alkyl group not having a substituent (unsubstituted alkyl group), but also an alkyl group having a substituent (substituted alkyl group).

[Pattern Forming Method]

The pattern forming method of the present invention includes, in this order, (1) a step of forming a film on a substrate, using an active-light-sensitive or radiation-sensitive resin composition containing a resin (A) which has a repeating unit having a phenolic hydroxyl group, and a repeating unit having a group that decomposes by the action of an acid to generate a carboxyl group, and a compound (B) that generates an acid upon irradiation with active light or radiation; (2) a step of exposing the film; and (4) a step of developing the exposed film using a developer including an organic solvent, in which the developer including an organic solvent contains an organic solvent having 8 or more carbon atoms and 2 or less heteroatoms in the amount of 50% by mass or more.

By the pattern forming method, the sensitivity, the resolving performance, and the pattern shape are excellent. The reason therefor is not clear, but is presumed to be as follows.

That is, by using an organic solvent having a large number of carbon atoms as a developer, permeation of the developer into a film (resist film) after exposure is suppressed, and dissolution or swelling of the resist film is suppressed.

As a result, collapse of the formed pattern (line) is suppressed, and even a small line width enables resolution, and thus, the resolving performance is considered to be excellent. Further, similarly, the resist film after exposure easily remains while not being dissolved even with a small exposure dose, and thus, it is considered that the sensitivity becomes good and the pattern shape also becomes good.

Hereinafter, the respective steps included in the pattern forming method will be described.

(1) Film Formation

In order to form a film (an active-light-sensitive or radiation-sensitive resin composition film, or a resist film) on a substrate using a resist composition, the respective components which will be described later are dissolved in a solvent to prepare a resist composition, and filtered through a filter, if necessary, and then coated on a substrate. As the filter, a polytetrafluoroethylene-, polyethylene-, or nylon-made filter, which has a pore size of 0.1 microns or less, more preferably 0.05 microns or less, and still more preferably 0.03 microns or less, is preferable.

The resist composition is coated on a substrate (for example, silicon- and silicon dioxide-coated substrates), as used for manufacture of an integrated circuit element, by a suitable coating method such as a method using a spinner, followed by drying, to form a chemical amplification resist film. If necessary, various undercoat films (inorganic films and organic films) may also be formed on the underlayer of the resist film.

As a method for drying the coated resist, a method involving heating and drying is generally used. Heating may be carried out using an ordinary means installed in an exposure machine or a development machine, or may also be carried out using a hot plate, or the like. The heating is carried out at a heating temperature of preferably 80° C. to 150° C., more preferably 80° C. to 140° C., and still more preferably 80° C. to 130° C. The heating time is preferably 30 to 1,000 seconds, more preferably 60 to 800 seconds, and still more preferably 60 to 600 seconds.

For example, for the resolution of a 1:1 line-and-space pattern having a size of 30 nm or less, the film thickness of the formed resist film is preferably 50 nm or less. If the film thickness is 50 nm or less, occurrence of pattern collapse is further suppressed, and thus, more excellent resolving performance is obtained when a developing step which will be described later is applied.

The range of the film thickness is more preferably a range from 15 nm to 45 nm. If the film thickness is 15 nm or more, sufficient etching resistance is obtained. The film thickness range is more preferably from 15 nm to 40 nm. If the film thickness falls within this range, etching resistance and more excellent resolving performance can be simultaneously satisfied.

Furthermore, in the pattern forming method of the present invention, an overcoat may be formed on the upper layer of the resist film. It is preferable that overcoat is not mixed with a resist film and can be uniformly coated on the upper layer of the resist film.

The overcoat is not particularly limited, an overcoat known in the related art can be formed according to a method known in the related art, and an overcoat can also be formed, based on the description of paragraphs <0072> to <0082> of JP2014-059543A, for example.

In the developing step, in a case of using a developer containing an organic solvent, it is preferable that an overcoat containing a basic compound as described in JP2013-61648A, for example, is formed on a resist film.

(2) Film Exposure

The formed resist film is irradiated with active light or radiation through a predetermined mask. Further, for irradiation with electron beams, writing which is carried out not through a mask (direct writing) is common.

The active light or radiation is not particularly limited, and examples thereof include KrF excimer laser, ArF excimer laser, EUV light, and electron beams, with EUV light and electron beams being preferable.

(3) Bake

In the pattern forming method of the present invention, it is preferable that bake (heating) is carried out after exposure and before development. By the bake, the reaction of the exposed area is promoted, and the sensitivity or the pattern shape becomes better.

The heating temperature is preferably 80° C. to 150° C., preferably 80° C. to 140° C., and still more preferably 80° C. to 130° C.

The heating time is preferably 30 to 1,000 seconds, more preferably 60 to 800 seconds, and still more preferably 60 to 600 seconds.

The heating may be carried out using an ordinary means installed in an exposure machine or a development machine, or may also be carried out using a hot plate or the like.

(4) Development

In the pattern forming method of the present invention, the exposed resist film is developed using a developer (hereinafter also referred to as a "specific developer") containing an organic solvent having 8 or more carbon atoms and 2 or less heteroatoms in the amount of 50% by mass or more.

By carrying out development using the specific developer as described above, effects of exhibiting good resolving performance, and the like are exhibited.

The organic solvent containing the specific developer is preferably an ester-based solvent having 8 or more carbon atoms and 2 or less heteroatoms for a reason that the effects of the present invention are more excellent.

The number of carbon atoms of the ester-based solvent is preferably 8 to 14, more preferably 8 to 12, and still more preferably 8 to 10.

The heteroatom of the ester-based solvent is an atom other than a carbon atom and a hydrogen atom, and examples thereof include an oxygen atom, a nitrogen atom, and a sulfur atom. The number of heteroatoms is preferably 1 or 2.

Examples of the ester-based solvent include hexyl acetate, heptyl acetate, octyl acetate, pentyl propionate, hexyl propionate, heptyl propionate, butyl butanoate, pentyl butanoate, hexyl butanoate, propyl pentanoate, butyl pentanoate, pentyl pentanoate, ethyl hexanoate, propyl hexanoate, butyl hexanoate, methyl heptanoate, ethyl heptanoate, propyl heptanoate, cyclohexyl acetate, cycloheptyl acetate, 2-ethylhexyl acetate, cyclopentyl propionate, isobutyl butanoate, isobutyl isobutanoate, isopropyl pentanoate, and isobutyl hexanoate.

The organic solvent contained in the specific developer is more preferably an ester-based solvent having a structure represented by the following General Formula (S) for a reason that the effects of the present invention are more excellent.

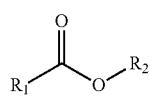

(S)

Here, in General Formula (S), $R_1$ and $R_2$ each independently represent a linear, branched, or cyclic alkyl group, and $R_1$ and $R_2$ satisfy the following relational expression.

9≥the number of carbon atoms of $R_1$+the number of carbon atoms of $R_2$+1≥8, the number of carbon atoms of $R_1$≥3, the number of carbon atoms of $R_2$≥3

The number of carbon atoms of $R_1$ is preferably 3 to 6, and more preferably 3 to 5.

The number of carbon atoms of $R_2$ is preferably 3 to 6, and more preferably 3 to 5.

Examples of the linear alkyl groups represented by $R_1$ and $R_2$ include an n-propyl group, an n-butyl group, and an n-pentyl group. Examples of the branched alkyl groups represented by $R_1$ and $R_2$ include an isopropyl group, an isobutyl group, and a t-butyl group.

Examples of the cyclic alkyl groups represented by $R_1$ and $R_2$ include a cyclopentyl group.

As the alkyl groups represented by $R_1$ and $R_2$, linear or branched alkyl groups are preferable.

Examples of the ester-based solvent having a structure represented by General Formula (S) include butyl butanoate, isobutyl butanoate, isobutyl isobutanoate, pentyl butanoate, and butyl pentanoate, and among these, butyl butanoate is preferable.

The content of organic solvent in the specific developer is not particularly limited as long as it is 50% by mass or more, but is preferably 50% to 100% by mass, more preferably 85% to 100% by mass, and still more preferably 95% to 100% by mass.

In addition, the specific developer may include a basic compound. Specific examples of the basic compound which may be included in the specific developer include the compounds exemplified as the basic compound which can be included in the active-light-sensitive or radiation-sensitive resin composition which will be described later.

(5) Rinsing

It is preferable that the pattern forming method of the present invention includes a step of carrying out rinsing using a rinsing liquid including an organic solvent after the step of carrying out development using a specific developer.

The organic solvent included in the rinsing liquid is not particularly limited, and examples thereof include at least one kind of solvent selected from a hydrocarbon-based solvent, a ketone-based solvent, an ester-based solvent, an alcohol-based solvent, an amide-based solvent, or an ether-based solvent, and among these, the hydrocarbon-based solvent is preferable.

The hydrocarbon-based solvent is a solvent composed of only carbon atoms and hydrogen atoms, and specific examples thereof include an aliphatic hydrocarbon-based solvent having 5 or more carbon atoms, such as pentane, hexane, octane, decane, undecane, dodecane, and hexadecane. An aliphatic hydrocarbon-based solvent having 8 or more carbon atoms is preferable, an aliphatic hydrocarbon-based solvent having 10 or more carbon atoms is more preferable, and decane, undecane, and dodecane are still more preferable.

Moreover, the upper limit value in the number of carbon atoms of the aliphatic hydrocarbon-based solvent is not particularly limited, and examples thereof include values of 16 or less, and the upper limit value is preferably a value of 14 or less, and more preferably a value of 12 or less.

Even in a case where the specific developer after the development is permeated into the resist film, the specific developer is rinsed using a rinsing liquid including the aliphatic hydrocarbon-based solvent, and accordingly, the swelling is more suppressed and the effects of the present invention are more excellent.

In the rinsing liquid, the organic solvent may be used singly or in combination of two or more kinds thereof.

The content of the organic solvent in the rinsing liquid is preferably 90% to 100% by mass, and more preferably 95% to 100% by mass, with respect to the total amount of the rinsing liquid.

Moreover, the present invention further relates to a resist pattern (resist film) formed by the pattern forming method of the present invention as described above, a method for manufacturing an electronic device, including the pattern forming method of the present invention as described above, and an electronic device manufactured by this manufacturing method.

The electronic device is suitably mounted on electric or electronic equipment (home electronics, OA/media-related equipment, optical equipment, telecommunication equipment, and the like).

Next, the resist composition will be described in detail.

(A) Resin

The resin (A) used in the resist composition is a resin which the solubility in an alkali developer is enhanced by the action of an acid, and the solubility in an organic solvent is reduced. The resin (A) has a repeating unit having a phenolic hydroxyl group, and a repeating unit having a group that decomposes by the action of an acid to generate a carboxyl group.

Examples of the repeating unit having a phenolic hydroxyl group included in the resin (A) include a repeating unit represented by the following General Formula (I).

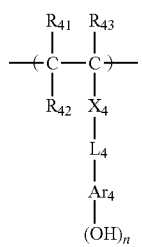

(I)

In the formula, $R_{41}$, $R_{42}$, and $R_{43}$ independently represent a hydrogen atom, an alkyl group, a halogen atom, a cyano group, or an alkoxycarbonyl group. Here, $R_{42}$ may be bonded to $Ar_4$ to form a ring, and $R_{42}$ in this case represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case of being bonded to $R_{42}$ to form a ring, represents an (n+2)-valent aromatic ring group.

n represents an integer of 1 to 5.

Preferred examples of the alkyl group of $R_{41}$, $R_{42}$, or $R_{43}$ in General Formula (I) include alkyl groups having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent; more preferred examples of the alkyl group include alkyl groups having 8 or less carbon atoms; and particularly preferred examples of the alkyl group include alkyl groups having 3 or less carbon atoms.

The cycloalkyl group of $R_{41}$, $R_{42}$, or $R_{43}$ in General Formula (I) may be monocyclic or polycyclic. Preferred examples thereof include monocyclic cycloalkyl groups having 3 to 8 carbon atoms, such as a cyclopropyl group, a cyclopentyl group, and a cyclohexyl group, each of which may have a substituent.

Examples of the halogen atom of $R_{41}$, $R_{42}$, or $R_{43}$ in General Formula (I) include a fluorine atom, a chlorine atom, a bromine atom, and an iodine atom, with a fluorine atom being particularly preferable.

The alkyl groups included in the alkoxycarbonyl group of $R_{41}$, $R_{42}$, or $R_{43}$ in General Formula (I) are the same as the alkyl groups in $R_{41}$, $R_{42}$, or $R_{43}$.

Preferable examples of the substituent in the respective groups include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the number of carbon atoms of the substituent is preferably 8 or less.

$Ar_4$ represents an (n+1)-valent aromatic ring group. The divalent aromatic ring group in a case where n is 1 may have a substituent, and preferable examples thereof include arylene groups having 6 to 18 carbon atoms, such as a phenylene group, a tolylene group, a naphthylene group, and an anthracenylene group, and aromatic ring groups including a hetero ring, such as thiophene, furan, pyrrole, benzothiophene, benzofuran, benzopyrrole, triazine, imidazole, benzimidazole, triazole, thiadiazole, and thiazole.

Suitable specific examples of the (n+1)-valent aromatic ring group in a case where n is an integer of 2 or more include a group obtained by excluding arbitrary (n-1) hydrogen atoms from the specific examples of the divalent aromatic ring group as described above.

The (n+1)-valent aromatic ring group may further have a substituent.

Examples of the substituent which can be included in the alkyl group, the cycloalkyl group, the alkoxycarbonyl group, the alkylene group, or the (n+1)-valent aromatic ring group as described above include alkoxy groups such as an alkyl group, a methoxy group, an ethoxy group, a hydroxyethoxy group, a propoxy group, a hydroxypropoxy group, and a butoxy group, and aryl groups such as a phenyl group, mentioned as $R_{41}$, $R_{42}$, or $R_{43}$ in General Formula (I).

Preferred examples of the alkyl group represented by $R_{64}$ in —CONR$_{64}$— ($R_{64}$ represents a hydrogen atom or an alkyl group) represented by $X_4$ include alkyl groups having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, and more preferably alkyl groups having 8 or less carbon atoms.

$X_4$ is preferably a single bond, —COO—, or —CONH—, and more preferably a single bond or —COO—.

Preferred examples of the alkylene group in $L_4$ include alkylene groups having 1 to 8 carbon atoms, such as a methylene group, an ethylene group, a propylene group, a butylene group, a hexylene group, and an octylene group, each of which may have a substituent.

$Ar_4$ is more preferably an aromatic ring group having 6 to 18 carbon atoms, which may have a substituent, and particularly preferably a benzene ring group, a naphthalene ring group, or a biphenylene ring group.

The repeating unit represented by General Formula (I) preferably has a hydroxystyrene structure. That is, $Ar_4$ is preferably a benzene ring group.

Preferred examples of the repeating unit having a phenolic hydroxyl group, included in the resin (A), include a repeating unit represented by the following General Formula (p1).

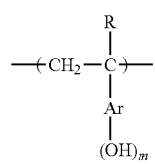

(p1)

R in General Formula (p1) represents a hydrogen atom, a halogen atom, or a linear or branched alkyl group having 1 to 4 carbon atoms. A plurality of R's may be the same as or different from each other. As R in General Formula (p1), a hydrogen atom is particularly preferable.

Ar in General Formula (p1) represents an aromatic ring, and examples thereof include aromatic hydrocarbon rings having 6 to 18 carbon atoms, which may have a substituent, such as a benzene ring, a naphthalene ring, an anthracene ring, a fluorene ring, and a phenanthrene ring, or aromatic hetero rings including a hetero ring, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, a benzene ring is most preferable.

m in General Formula (p1) represents an integer of 1 to 5, and is preferably 1.

Specific examples of the repeating unit having a phenolic hydroxyl group included in the resin (A) are shown below, but the present invention is not limited thereto. In the formula, a represents 1 or 2.

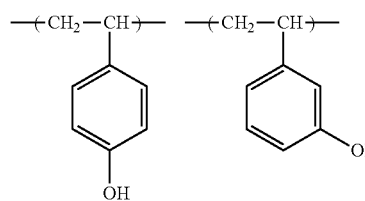

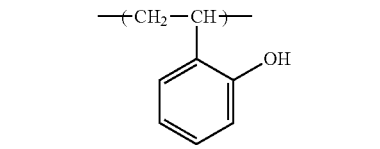

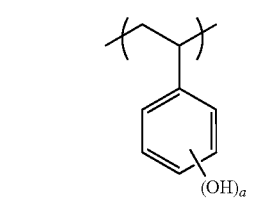

(B-1)

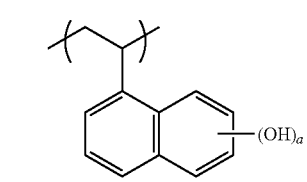

(B-2)

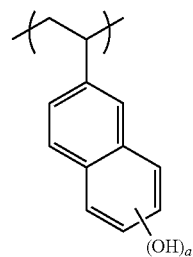

(B-3)

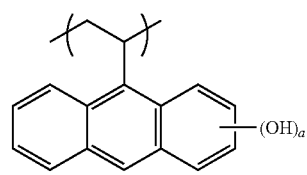

(B-4)

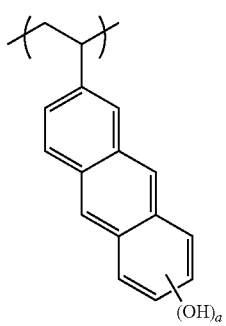

(B-5)

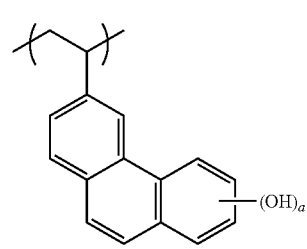

(B-6)

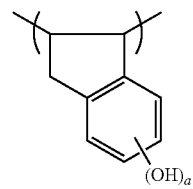

(B-7)

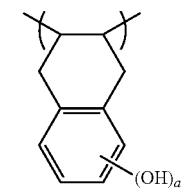

(B-8)

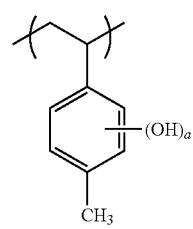

(B-9)

(B-10) 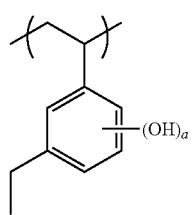
(B-11) 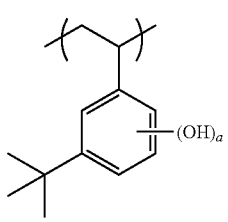
(B-12) 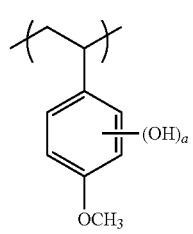
(B-13) 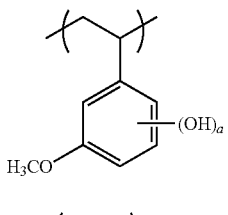
(B-14) 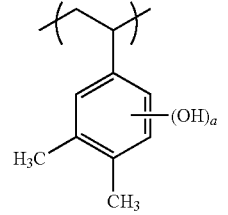
(B-15) 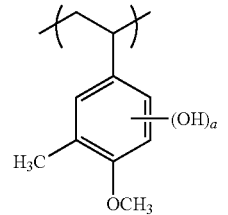
(B-16) 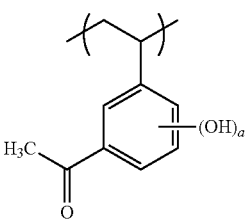
(B-17) 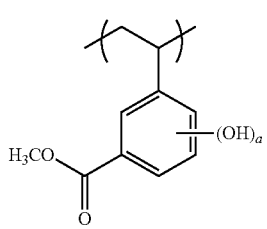
(B-18) 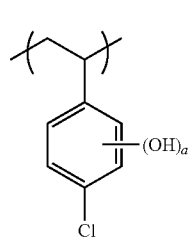
(B-19) 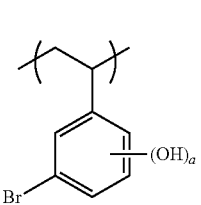
(B-20) 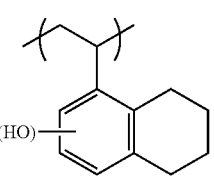
(B-21) 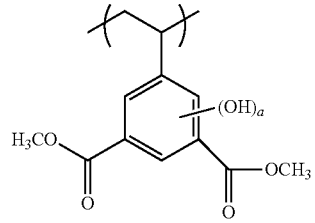
(B-22) 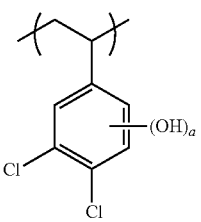
(B-23) 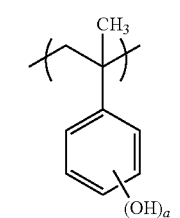

-continued (B-24) (B-25) (B-26) (B-27) (B-28) (B-29) (B-30) (B-31) (B-32) (B-33) (B-34) (B-35) (B-36) (B-37)

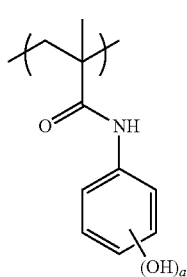
(B-38)

The content of the repeating units having a phenolic hydroxyl group is preferably 1% to 50% by mole, more preferably 5% to 45% by mole, still more preferably 10% to 40% by mole, and particularly preferably 20% to 40% by mole, with respect to all the repeating units in the resin (A).

The repeating unit having a group that decomposes by the action of an acid to generate a carboxyl group, included in the resin (A), is a repeating unit having a group which is substituted with a group that leaves upon decomposition of a hydrogen atom in a carboxyl group by the action of an acid.

Examples of the group capable of leaving by the action of an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the repeating unit having a group that decomposes by the action of an acid to generate a carboxyl group, included in the resin (A), a repeating unit represented by the following General Formula (AI) is preferable.

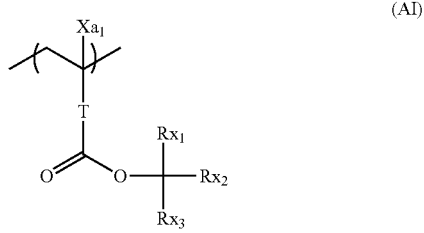
(AI)

In General Formula (AI), $Xa_1$ represents a hydrogen atom or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. Here, in a case where all of $Rx_1$ to $Rx_3$ are (linear or branched) alkyl groups, it is preferable that at least two members out of $Rx_1$ to $Rx_3$ are methyl groups.

Two members out of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by —CH$_2$—$R_{11}$. $R_{11}$ represents a halogen atom (a fluorine atom or the like), a hydroxyl group, or a monovalent organic group, and examples thereof include an alkyl group having 5 or less carbon atoms, and an acyl group having 5 or less carbon atoms, preferably an alkyl group having 3 or less carbon atoms, and more preferably a methyl group. In one aspect, $Xa_1$ is preferably a hydrogen atom, a methyl group, a trifluoromethyl group, a hydroxymethyl group, or the like.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —CH$_2$- group, a —(CH$_2$)$_2$- group, or a —(CH$_2$)$_3$- group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group is preferable.

As the cycloalkyl group of each of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the cycloalkyl group formed by the bonding of two members of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkyl group having 5 or 6 carbon atoms is particularly preferable.

In the cycloalkyl group formed by the bonding of two members of $Rx_1$ to $Rx_3$, for example, one of the methylene groups constituting the ring may be substituted with a heteroatom such as an oxygen atom, or with a group having a heteroatom, such as a carbonyl group.

An aspect of the repeating unit represented by General Formula (AI), for example, in which $Rx_1$ is a methyl group or an ethyl group, and $Rx_2$ and $Rx_3$ are bonded to form the cycloalkyl group as described above, is preferable.

The respective groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with those having 8 or less carbon atoms being preferable.

The repeating unit represented by General Formula (AI) preferably represents an acid-decomposable tertiary alkyl (meth)acrylate ester-based repeating unit (the repeating unit in which $Xa_1$ represents a hydrogen atom or a methyl group, and T represents a single bond). More preferably, the repeating unit is a repeating unit in which $Rx_1$ to $Rx_3$ each independently represent a linear or branched alkyl group, and more preferably a repeating unit in which $Rx_1$ to $Rx_3$ each independently represent a linear alkyl group.

Specific examples of the repeating unit having a group that decomposes by the action of an acid to generate a carboxyl group, included in the resin (A), are shown below, but the present invention is not limited thereto.

In the specific examples, Rx and $Xa_1$ each represent a hydrogen atom, CH$_3$, CF$_3$, or CH$_2$OH. Rxa and Rxb each represent an alkyl group having 1 to 4 carbon atoms. Z represents a substituent including a polar group, and in a case where Z's are present in plural numbers, they are independent of each other. p represents 0 or a positive integer. Examples of the substituent including a polar group, represented by Z, include a hydroxyl group, a cyano group, an amino group, a linear or branched alkyl group having an alkylamido group or a sulfonamido group, and a cycloalkyl group, with an alkyl group having a hydroxyl group being preferable. As the branched alkyl group, an isopropyl group is particularly preferable.
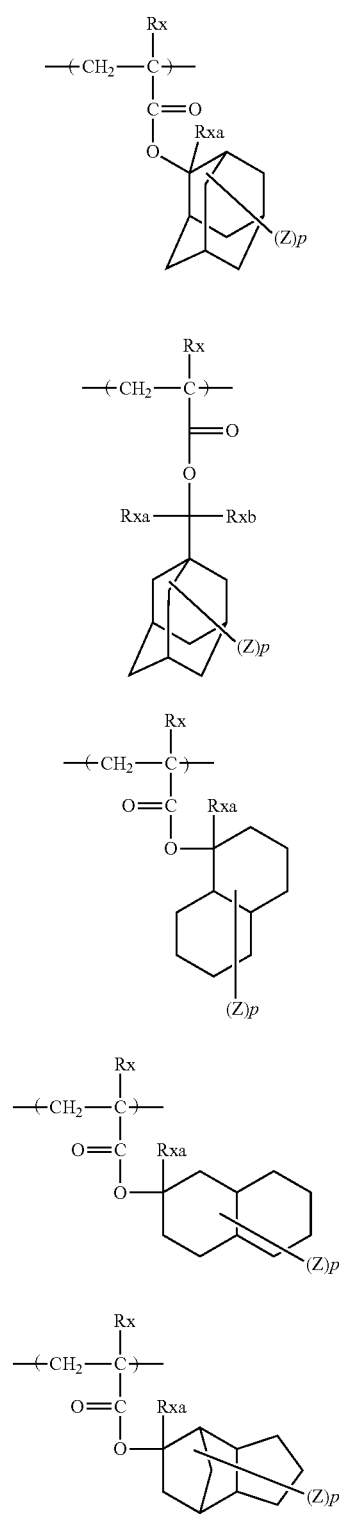
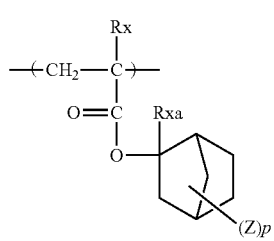
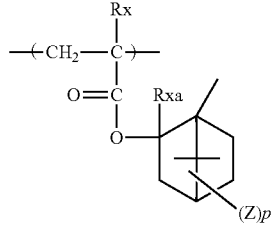
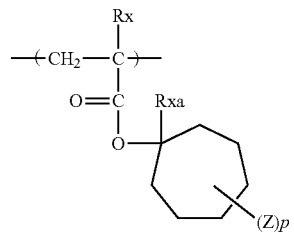
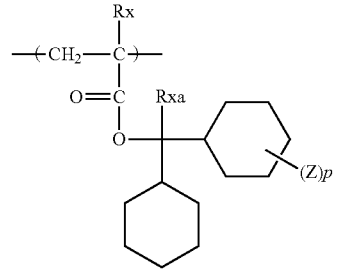
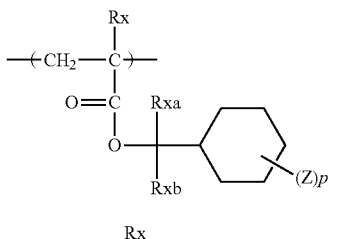
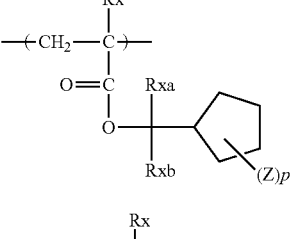
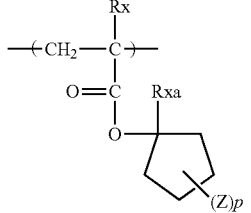

-continued
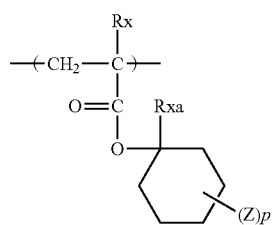
13
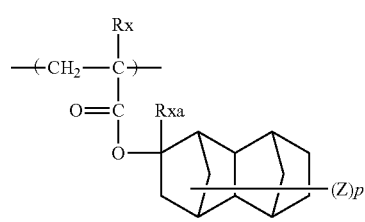
14
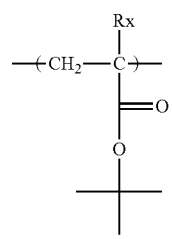
15
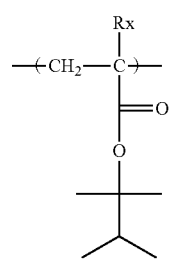
16
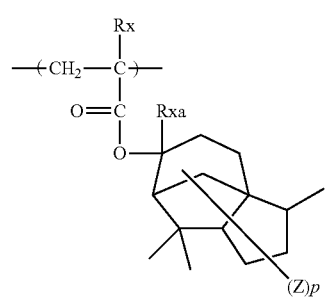
17
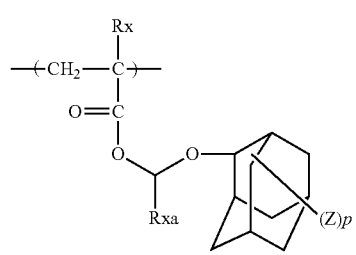
18
-continued
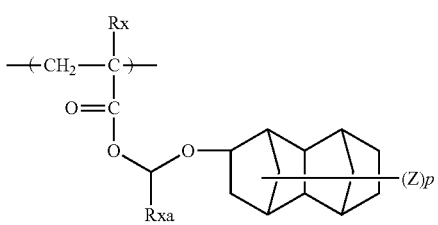
19
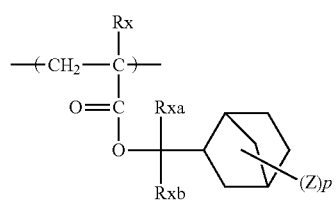
20
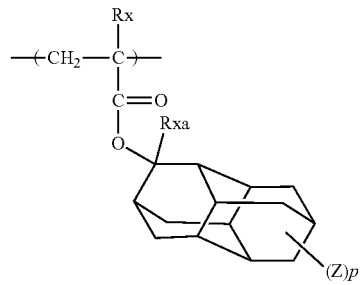
21
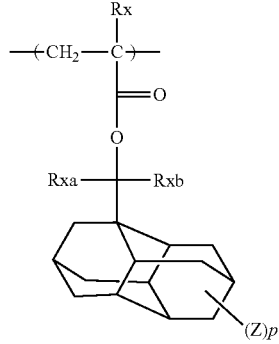
22
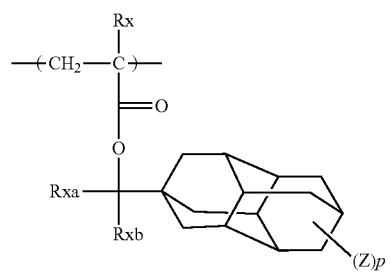
23
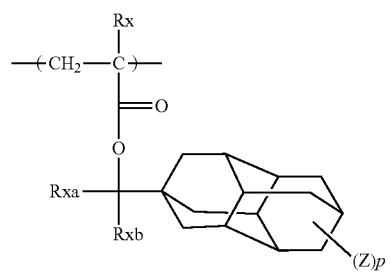
24

-continued

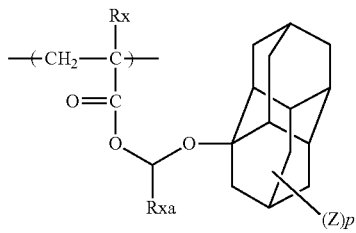
25

The content of the repeating units having a group that decomposes by the action of an acid to generate a carboxyl group is preferably 20% to 90% by mole, more preferably 25% to 80% by mole, still more preferably 30% to 70% by mole, and particularly preferably 50% to 70% by mole, with respect to all the repeating units in the resin (A).

It is preferable that the resin (A) further contains a repeating unit having a lactone group.

As the lactone group, any group may be used as long as it has a lactone structure, but the structure is preferably a 5- to 7-membered ring lactone structure, and more preferably a 5- to 7-membered ring lactone structure to which another ring structure is fused in the form capable of forming a bicyclo structure or a spiro structure. The resin (A) still more preferably has a repeating unit having a group having a lactone structure represented by any one of the following General Formulae (LC1-1) to (LC1-16). Further, a group having the lactone structure may be bonded directly to the main chain. Preferred examples of the lactone structures include the groups represented by General Formulae (LC1-1), (LC1-4), (LC1-5), (LC1-6), (LC1-13), and (LC1-14).

LC1-1
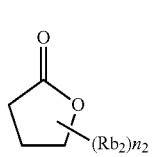

LC1-2
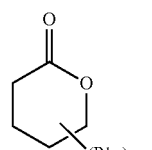

LC1-3
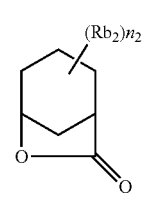

LC1-4
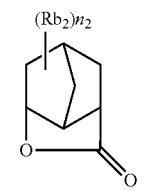

-continued

LC1-5
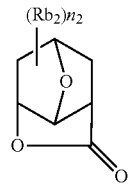

LC1-6
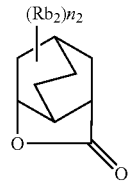

LC1-7
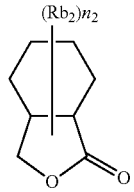

LC1-8
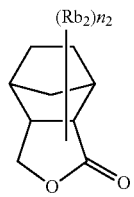

LC1-9
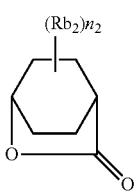

LC1-10
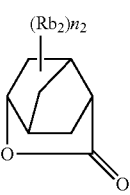

LC1-11
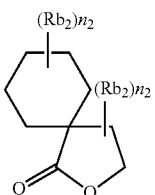

LC1-12
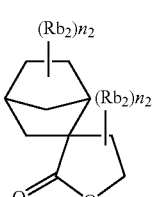

-continued

LC1-13
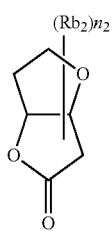

LC1-14

LC1-15
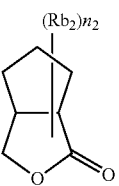

LC-16
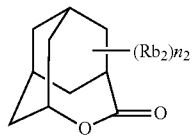

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. $n_2$ represents an integer of 0 to 4. When $n_2$ is 2 or more, $Rb_2$'s which are present in plural numbers may be the same as or different from each other, and further, $Rb_2$'s which are present in plural numbers may be bonded to each other to form a ring.

Examples of the repeating unit having a group having a lactone structure represented by any one of General Formulae (LC1-1) to (LC1-16) include repeating units represented by the following General Formula (AI).

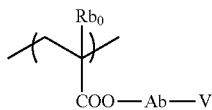
(AI)

In General Formula (AI), $Rb_0$ represents a hydrogen atom, a halogen atom, or an alkyl group having 1 to 4 carbon atoms.

Preferred examples of the substituent that the alkyl group of $Rb_0$ may have include a hydroxyl group and a halogen atom.

Examples of the halogen atoms of $Rb_0$ include a fluorine atom, a chlorine atom, a bromine atom, and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, a carboxyl group, or a divalent linking group obtained by combining these groups. Ab is preferably a single bond or a linking group represented by $-Ab_1-CO_2-$. $Ab_1$ is a linear or branched alkylene group, or a monocyclic or polycyclic cycloalkylene group, and preferably a methylene group, an ethylene group, a cyclohexylene group, an adamantylene group, or a norbornylene group.

V represents a group represented by any one of General Formulae (LC1-1) to (LC1-16).

The repeating unit having a group with a lactone structure is usually present in the form of an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90 or more, and more preferably 95 or more.

Specific examples of the repeating unit having a group with a lactone structure are shown below, but the present invention is not limited thereto.

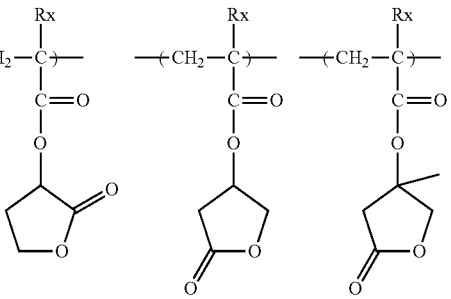

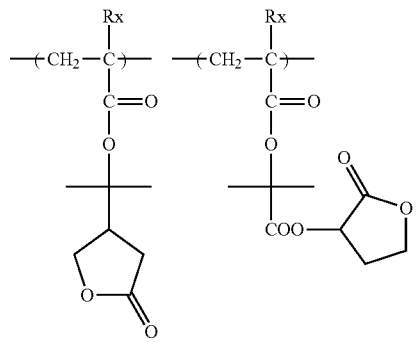

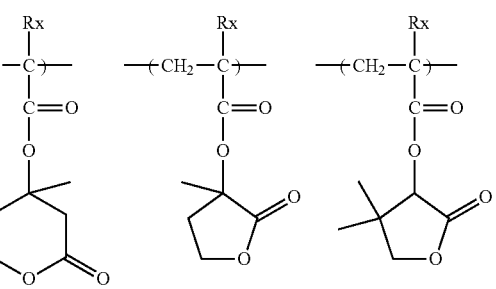
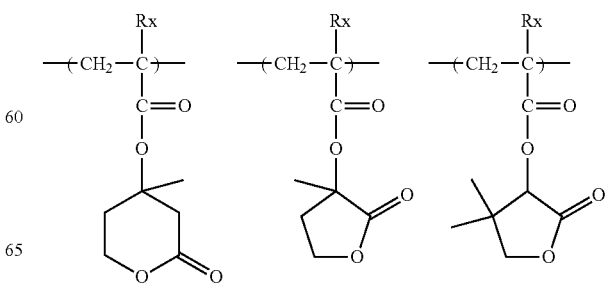

-continued
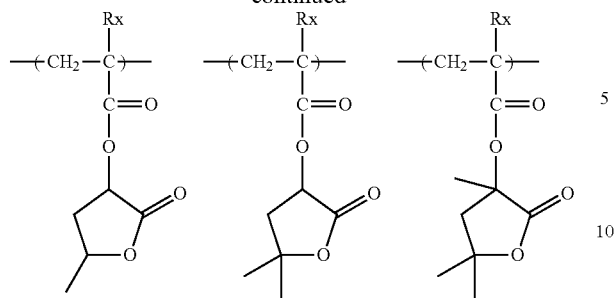
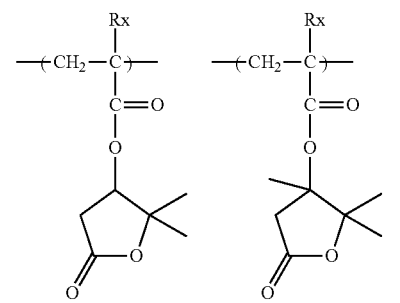
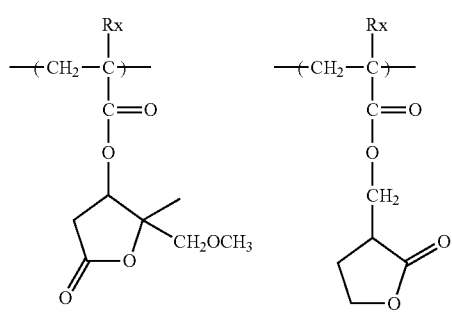
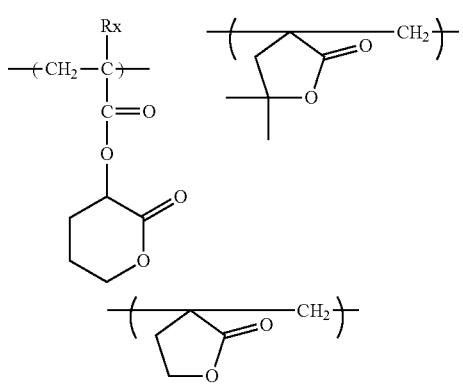
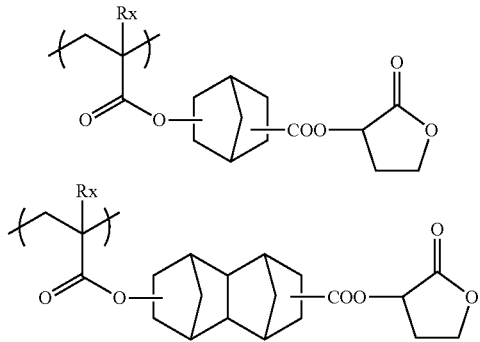
-continued
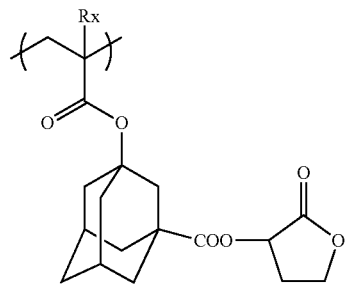
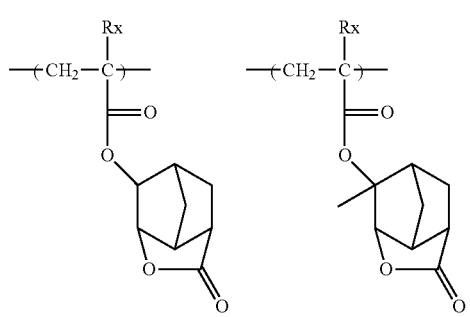
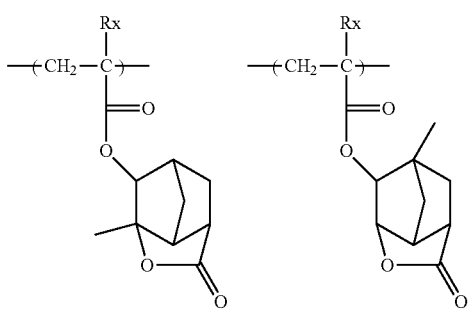
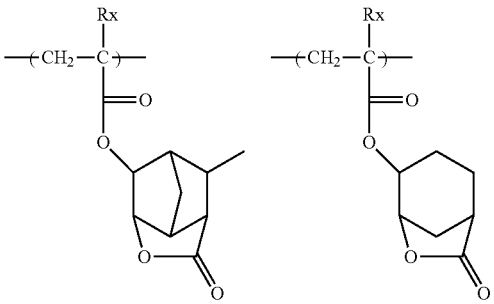
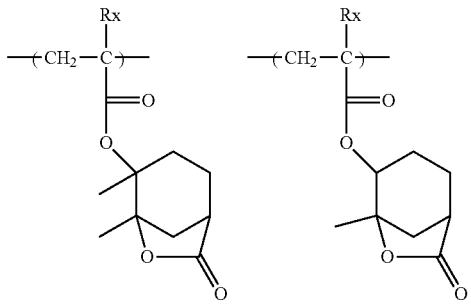

27
-continued

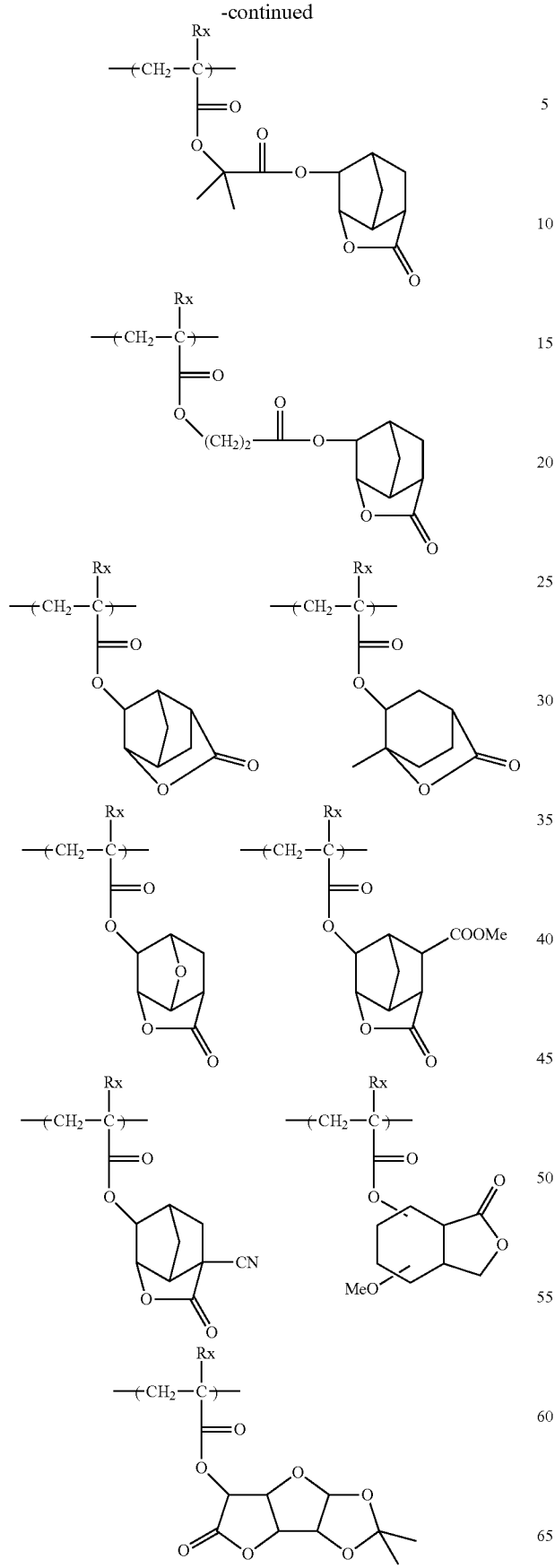

28
-continued

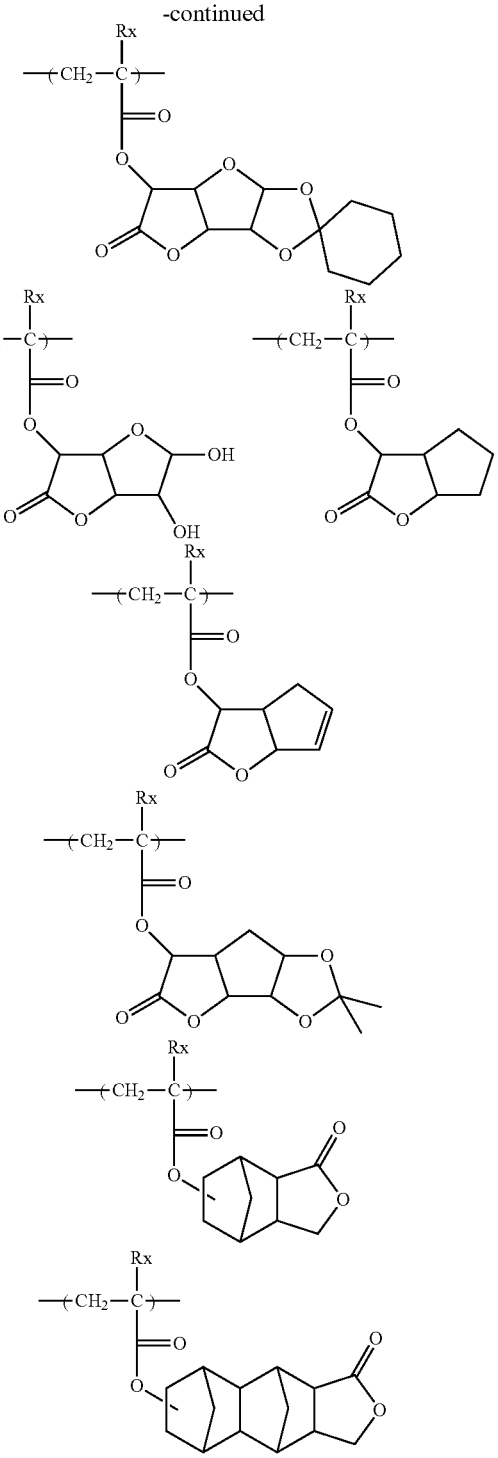

(in the formulae, Rx represents H, CH₃, CH₂OH, or CF₃)

The content of the repeating units having a lactone group is preferably 1% to 30% by mole, more preferably 5% to 25% by mole, and still more preferably 5% to 20% by mole, with respect to all the repeating units in the resin (A).

The resin (A) may further have a repeating unit containing an organic group having a polar group, in particular, a repeating unit having an alicyclic hydrocarbon structure substituted with a polar group.

Thus, the substrate adhesiveness and the developer affinity are improved. As the alicyclic hydrocarbon structure of the alicyclic hydrocarbon structure substituted with a polar group, an adamantyl group, a diamantyl group, or a norbornane group are preferable. As the polar group, a hydroxyl group or a cyano group is preferable.

Specific examples of the repeating unit having a polar group are shown below, but the present invention is not limited thereto.

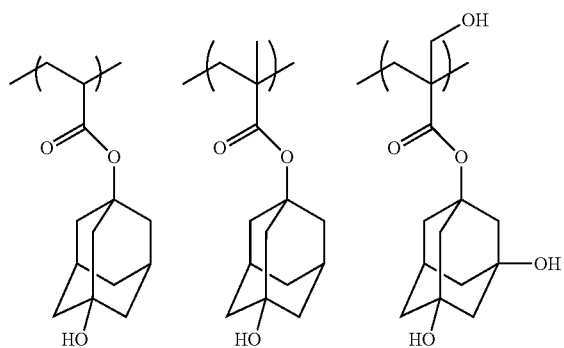

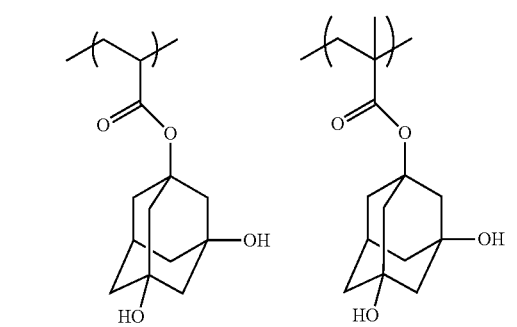

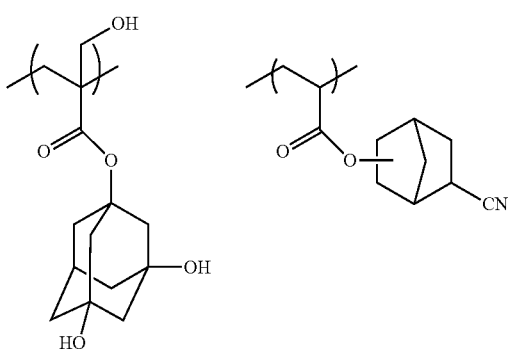

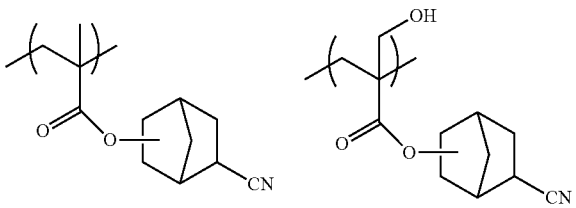

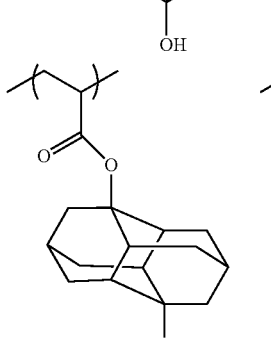

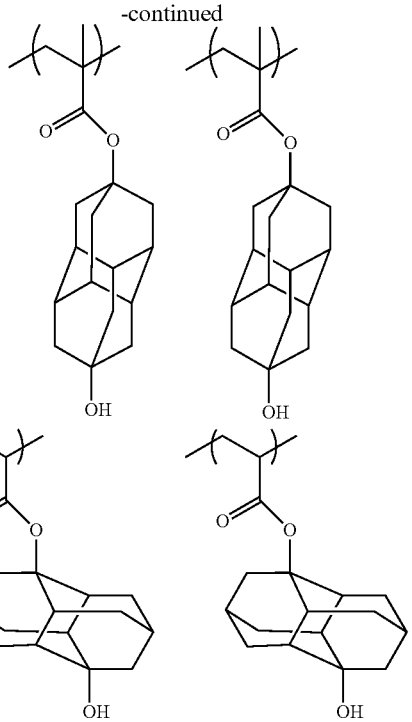

In a case where the resin (A) has a repeating unit containing an organic group having a polar group, the content thereof is preferably 1% to 30% by mole, more preferably 5% to 25% by mole, and still more preferably 5% to 20% by mole, with respect to all the repeating units in the resin (A).

In addition, as a repeating unit other than the above repeating units, a repeating unit having a group that generates an acid upon irradiation with active light or radiation (a photoacid generating group) may also be included. In this case, a repeating unit having this photoacid generating group may be considered to correspond to a compound (B) that generates an acid upon irradiation with active light or radiation which will be described later.

Examples of such a repeating unit include repeating units represented by the following General Formula (4).

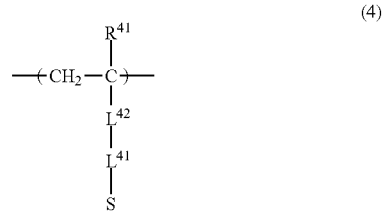

(4)

$R^{41}$ represents a hydrogen atom or a methyl group. $L^{41}$ represents a single bond or a divalent linking group. $L^{42}$ represents a divalent linking group. S represents a structure site that decomposes upon irradiation with active light or radiation to generate an acid in the side chain.

Specific examples of the repeating unit represented by General Formula (4) are shown below, but the present invention is not limited thereto.

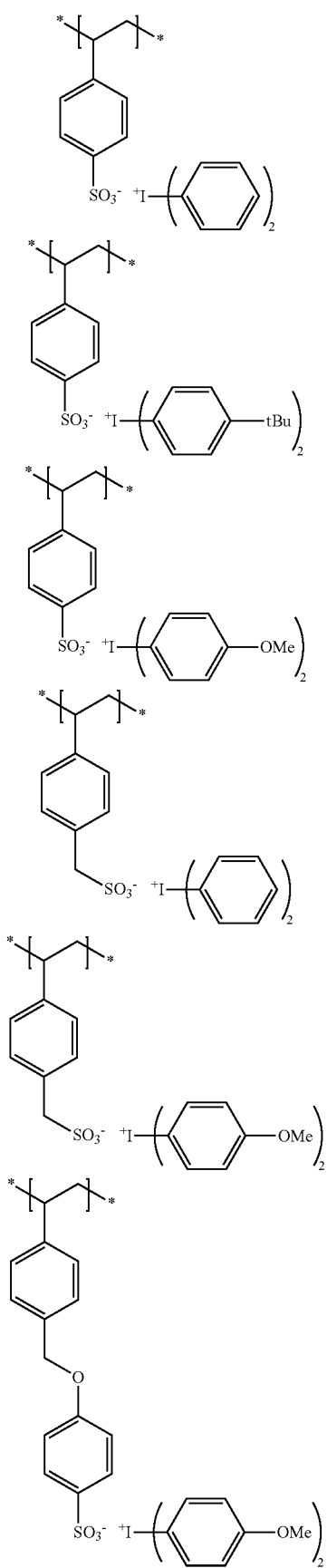
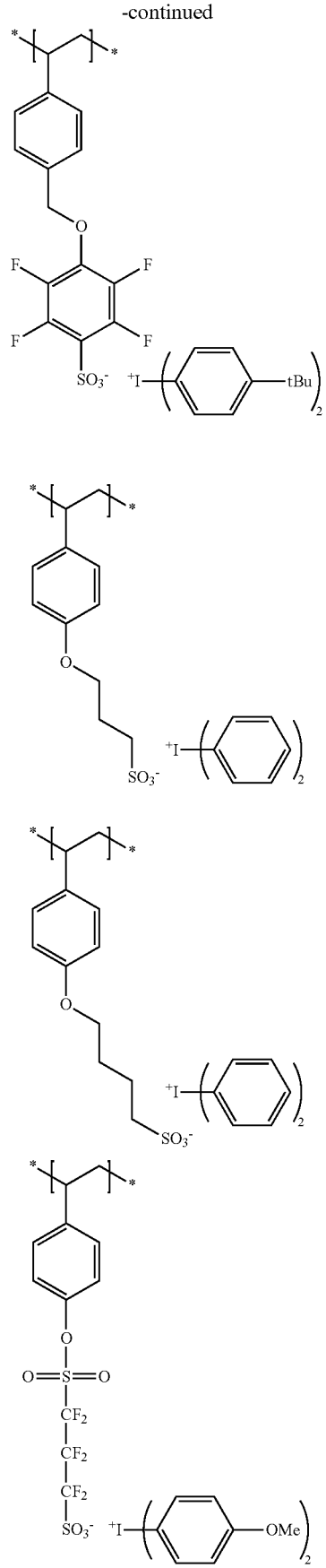

-continued
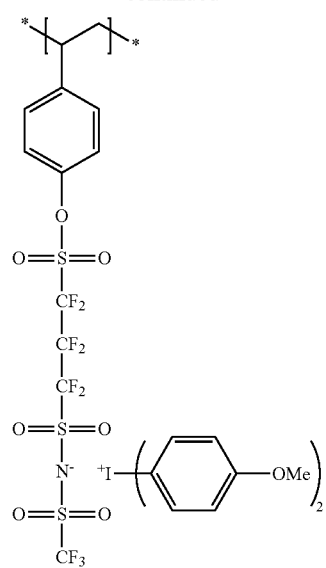
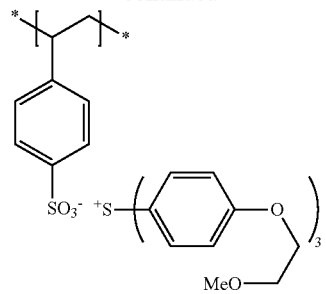
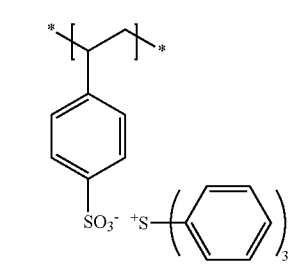
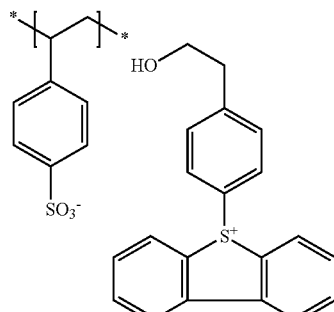
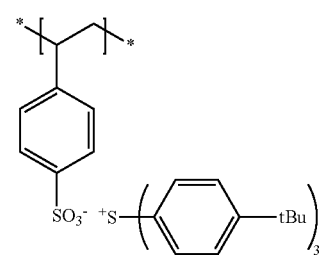
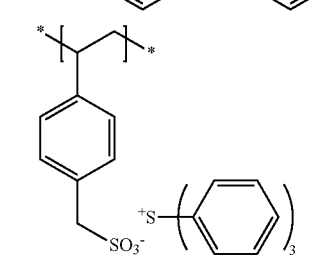
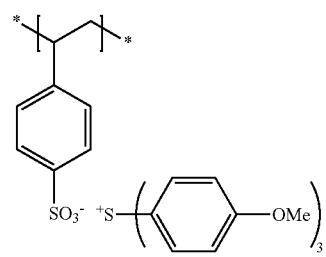
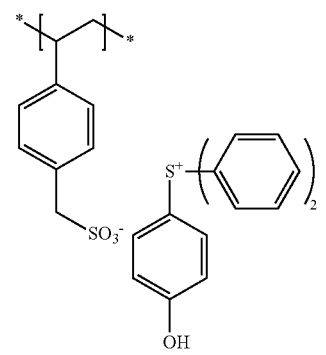
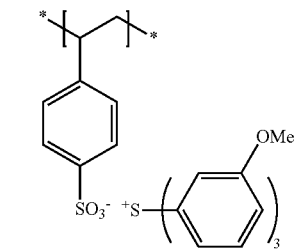
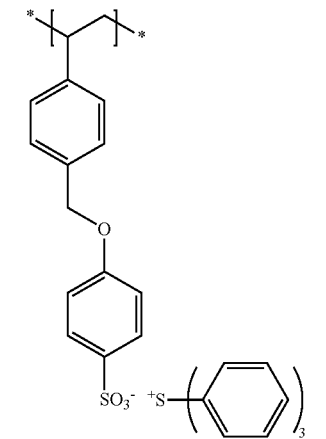

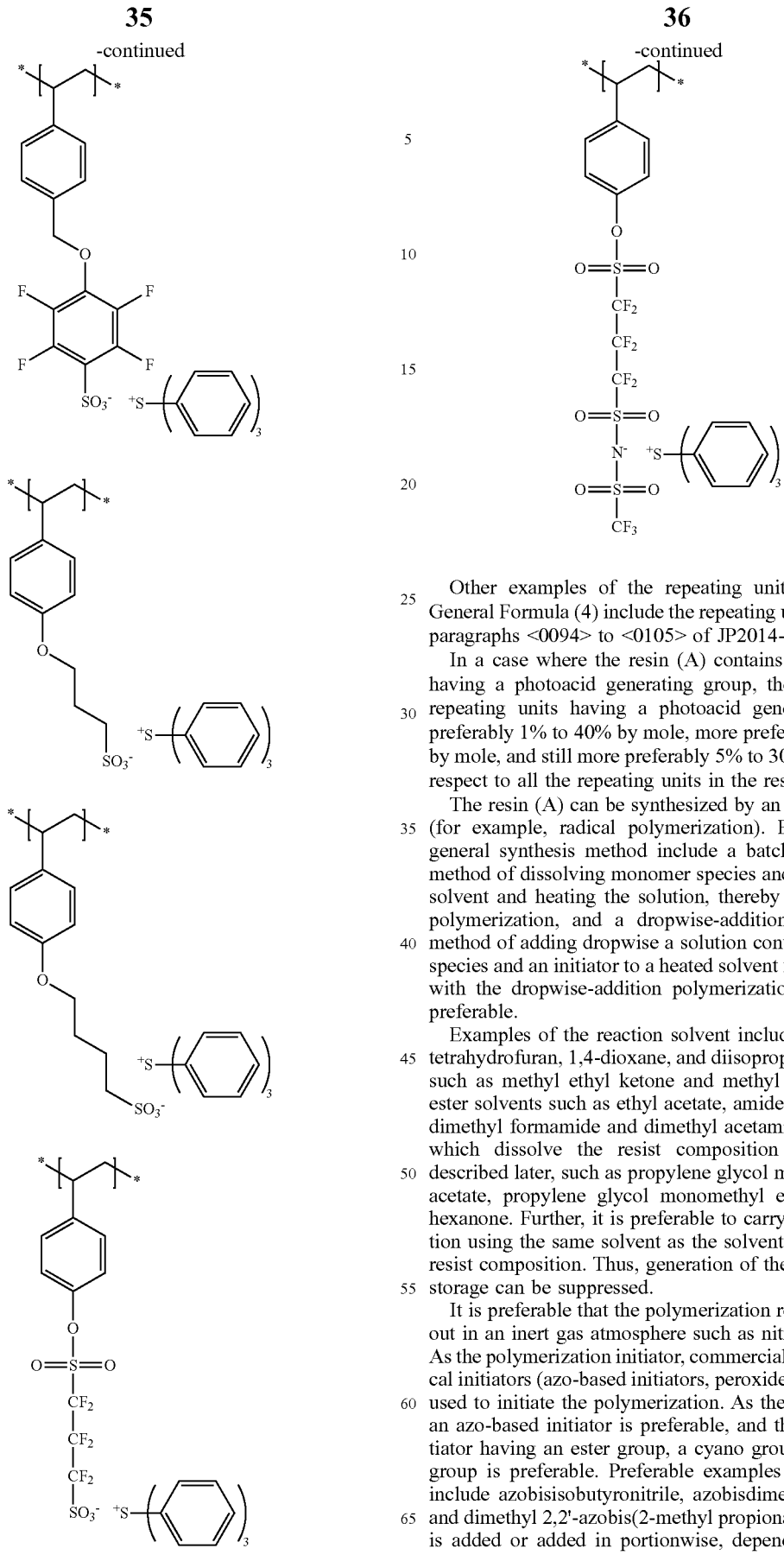

Other examples of the repeating unit represented by General Formula (4) include the repeating units described in paragraphs <0094> to <0105> of JP2014-041327A.

In a case where the resin (A) contains a repeating unit having a photoacid generating group, the content of the repeating units having a photoacid generating group is preferably 1% to 40% by mole, more preferably 5% to 35% by mole, and still more preferably 5% to 30% by mole, with respect to all the repeating units in the resin (A).

The resin (A) can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable.

Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the resist composition which will be described later, such as propylene glycol monomethyl ether acetate, propylene glycol monomethyl ether, and cyclohexanone. Further, it is preferable to carry out polymerization using the same solvent as the solvent contained in the resist composition. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is normally 10° C. to 150° C., preferably 30° C. to 120° C., and more preferably 60° C. to 100° C.

For the purification, the same method as that for the resin (D) which will be described later can be used, and an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a reprecipitation method of dropwise adding a resin solution into a poor solvent to solidify the resin in the poor solvent, thereby removing the residual monomers and the like; and a purification method in a solid state, such as rinsing of a resin slurry with a poor solvent after separation of the slurry by filtration can be used.

The weight-average molecular weight of the resin (A) is a value in terms of polystyrene by a GPC method, and is preferably 1,000 to 200,000, more preferably 3,000 to 20,000, and most preferably 5,000 to 15,000. By setting the weight-average molecular weight to 1,000 to 200,000, the heat resistance or the dry etching resistance can be prevented from being deteriorated, and the film forming properties can be prevented from being deteriorated due to deteriorated developability or increased viscosity.

In a particularly preferred aspect, the weight-average molecular weight of the resin (A) in a value in terms of polystyrene by a GPC method is 3,000 to 9,500. By setting the weight-average molecular weight to 3,000 to 9,500, in particular, a resist residue (hereinafter also referred to as a "scum") is suppressed, and thus, a better pattern can be formed.

A dispersity (molecular weight distribution) in a range of usually 1 to 5, preferably 1 to 3, more preferably 1.2 to 3.0, and particularly preferably 1.2 to 2.0 is used. As the dispersity is smaller, the resolution and the resist shape are excellent, the side wall of the resist pattern is smooth, and the roughness is excellent.

In the resist composition, the content of the resin (A) is preferably 50% to 99.9% by mass, and more preferably 60% to 99.0% by mass, with respect to the total solid content.

Furthermore, in the resist composition, the resin (A) may be used singly or in combination of plural kinds thereof.

(B) Compound That Generates Acid upon Irradiation with Active Light or Radiation The resist composition contains a compound that generates an acid upon irradiation with active light or radiation (also referred to as a "photoacid generator" or a "compound (B)"). As such a photoacid generator, a compound may be appropriately selected from known compounds that generate an acid upon irradiation with active light or radiation which are used for a photoinitiator for cationic photopolymerization, a photoinitiator for radical photopolymerization, a photodecoloring agent for coloring agents, a photodiscoloring agent, a microresist, or the like, and a mixture thereof, and used.

Examples of the compound include a diazonium salt, a phosphonium salt, a sulfonium salt, an iodonium salt, imidosulfonate, oxime sulfonate, diazodisulfone, disulfone, and o-nitrobenzyl sulfonate.

In addition, as a compound in which a group or compound that generates an acid upon irradiation with active light or radiation is introduced into the main or side chain of the polymer, for example, the compounds described in U.S. Pat. No. 3,849,137A, GE3914407A, JP1988-26653A (JP-S63-26653A), JP1980-164824A (JP55-164824A), JP1987-69263A (JP62-69263A), JP1988-146038A (JP63-146038A), JP1988-163452A (JP63-163452A), JP1987-153853A (JP62-153853A), JP1988-146029A (JP63-146029A), and the like can be used.

In addition, the compounds that generates an acid by light described in U.S. Pat. No. 3,779,778A, EP126712B, and the like can also be used.

Among the preferred compounds that decomposes upon irradiation with active light or radiation to generate an acid, there may be compounds represented by the following General Formulae (ZI), (ZII), and (ZIII).

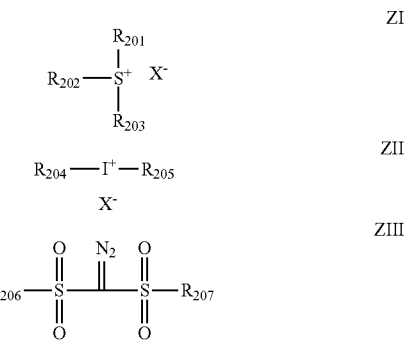

In General Formula (ZI), $R_{201}$, $R_{202}$, and $R_{203}$ each independently represent an organic group.

$X^-$ represents a non-nucleophilic anion, and preferred examples thereof include a sulfonate anion, a carboxylate anion, a bis(alkylsulfonyl)amido anion, a tris(alkylsulfonyl)methide anion, $BF_4^-$, $PF_6^-$, and $SbF_6^-$, with an organic anion containing a carbon atom being preferable.

Preferred examples of the organic anion include organic anions represented by the following formulae.

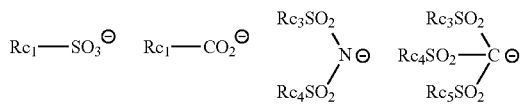

In the formula, $Rc_1$ represents an organic group.

Examples of the organic group in $Rc_1$ include those having 1 to 30 carbon atoms, and preferably an alkyl group which may be substituted, an aryl group, or a group formed by linking these plural groups through a linking group such as a single bond, —O—, —CO$_2$—, —S—, —SO$_3$—, and —SO$_2$N(Rd$_1$)-. Rd$_1$ represents a hydrogen atom or an alkyl group.

$Rc_3$, $Rc_4$, and $Rc_5$ each independently represent an organic group. Preferred examples of the organic group in $Rc_3$, $Rc_4$, or $Rc_5$ include the same groups as the preferred organic groups in $Rc_1$, with a perfluoroalkyl group having 1 to 4 carbon atoms being most preferable.

$Rc_3$ and $Rc_4$ may be bonded to each other to form a ring. Examples of the group formed by the bonding of $Rc_3$ and $Rc_4$ include an alkylene group and an arylene group. A preferred example thereof is a perfluoroalkylene group having 2 to 4 carbon atoms.

The organic group of each of $Rc_1$, and $Rc_3$ to $Rc_5$ is particularly preferably an alkyl group having a fluorine atom or a fluoroalkyl group substituted at the 1-position, or a phenyl group substituted with a fluorine atom or a fluoroalkyl group. By having a fluorine atom or a fluoroalkyl group, the acidity of the generated acid generated upon irradiation with light increases, and thus, the sensitivity is improved. Further, by the bonding of Rc$_3$ and Rc$_4$ to form a ring, the acidity of the generated acid generated upon irradiation with light increases, and thus, the sensitivity is improved.

The number of carbon atoms of the organic group as each of $R_{201}$, $R_{202}$, and $R_{203}$ is generally 1 to 30, and preferably 1 to 20.

Furthermore, two members out of $R_{201}$ to $R_{203}$ may be bonded to each other to form a ring structure, and may include an oxygen atom, a sulfur atom, an ester bond, an amide bond, or a carbonyl group within the ring. Examples of the group formed by the bonding of two members out of $R_{201}$ to $R_{203}$ include alkylene groups (for example, a butylene group and a pentylene group).

Specific examples of the organic group as each of $R_{201}$, $R_{202}$, and $R_{203}$ include the corresponding groups in the compounds (ZI-1), (ZI-2), and (ZI-3) which will be described later.

Moreover, it may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of one compound represented by General Formula (ZI).

More preferred examples of the component (ZI) include the compounds (ZI-1), (ZI-2), and (ZI-3) which will be described later.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be an aryl group, or a part of $R_{201}$ to $R_{203}$ may be an aryl group and the remainders are an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group of the arylsulfonium compound is preferably an aryl group such as a phenyl group and a naphthyl group, or a heteroaryl group such as an indole residue and a pyrrole residue, and is more preferably a phenyl group or an indole residue. In a case where the arylsulfonium compound has two or more aryl groups, two or more aryl groups that are present may be the same as or different from each other.

The alkyl group that the arylsulfonium compound may have, if necessary, is preferably a linear or branched alkyl group having 1 to 15 carbon atoms, and examples thereof include a methyl group, an ethyl group, a propyl group, an n-butyl group, a sec-butyl group, and a t-butyl group.

The cycloalkyl group which the arylsulfonium compound may have, if necessary, is preferably a cycloalkyl group having 3 to 15 carbon atoms, and examples thereof include a cyclopropyl group, a cyclobutyl group, and a cyclohexyl group.

The aryl group, the alkyl group, or the cycloalkyl group of each of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group. Preferred substituents are a linear or branched alkyl group having 1 to 12 carbon atoms, a cycloalkyl group having 3 to 12 carbon atoms, or a linear, branched, or cyclic alkoxy group having 1 to 12 carbon atoms, and particularly preferably an alkyl group having 1 to 4 carbon atoms or an alkoxy group having 1 to 4 carbon atoms. The substituent may be substituted with any one or all of three $R_{201}$ to $R_{203}$. Incidentally, in a case where $R_{201}$ to $R_{203}$ are each an aryl group, the substituent is preferably substituted at the p-position of the aryl group.

Next, the compound (ZI-2) will be described. The compound (ZI-2) is a compound in which $R_{201}$ to $R_{203}$ in Formula (ZI) each independently represent an organic group not containing an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear, branched, or cyclic 2-oxoalkyl group, or an alkoxycarbonylmethyl group, and particularly preferably a linear or branched 2-oxoalkyl group.

The alkyl group as each of $R_{201}$ to $R_{203}$ may be linear or branched, and preferred examples thereof include linear or branched alkyl groups having 1 to 10 carbon atoms (for example, a methyl group, an ethyl group, a propyl group, a butyl group, and a pentyl group). The alkyl group as each of $R_{201}$ to $R_{203}$ is a linear or branched 2-oxoalkyl group or an alkoxycarbonylmethyl group.

Preferred examples of the cycloalkyl group as each of $R_{201}$ to $R_{203}$ include cycloalkyl groups having 3 to 10 carbon atoms (a cyclopentyl group, a cyclohexyl group, and a norbornyl group). The cycloalkyl group as each of $R_{201}$ to $R_{203}$ is preferably a cyclic 2-oxoalkyl group.

Preferred examples of the linear, branched, or cyclic 2-oxoalkyl group as each of $R_{201}$ to $R_{203}$ include a group having >C=O at the 2-position of the alkyl group and the cycloalkyl group.

Preferred examples of the alkoxy group in the alkoxycarbonylmethyl group as each of $R_{201}$ to $R_{203}$ include an alkoxy group having 1 to 5 carbon atoms (a methoxy group, an ethoxy group, a propoxy group, a butoxy group, and a pentoxy group).

$R_{201}$ to $R_{203}$ may further be substituted with a halogen atom, an alkoxy group (for example, having 1 to 5 carbon atoms), a hydroxyl group, a cyano group, or a nitro group.

The compound (ZI-3) is a compound represented by the following General Formula (ZI-3), and is also a compound having a phenacylsulfonium salt structure.

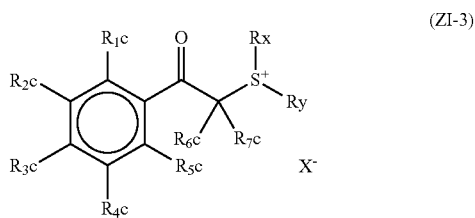

(ZI-3)

In General Formula (ZI-3), $R_1c$ to $R_5c$ each independently represent a hydrogen atom, an alkyl group, a cycloalkyl group, an alkoxy group, or a halogen atom.

$R_6c$ and $R_7c$ each independently represent a hydrogen atom, an alkyl group, or a cycloalkyl group.

Rx and Ry each independently represent an alkyl group, a cycloalkyl group, an allyl group, or a vinyl group.

Any two or more members out of $R_1c$ to $R_7c$, and Rx and Ry may be bonded to each other to form a ring structure, and these ring structures may include an oxygen atom, a sulfur atom, an ester bond, or an amide bond. The group formed by bonding of any two or more members out of $R_1c$ to $R_7c$, and Rx and Ry include a butylene group and a pentylene group.

$X^-$ represents a non-nucleophilic anion, and examples thereof include the same ones as the non-nucleophilic anion of $X^-$ in General Formula (ZI).

The alkyl group as each of $R_1c$ to $R_7c$ may be linear or branched, and preferred examples thereof include linear or branched alkyl groups having 1 to 20 carbon atoms, and preferably linear or branched alkyl groups having 1 to 12 carbon atoms (for example, a methyl group, an ethyl group, a linear or branched propyl group, a linear or branched butyl group, and a linear or branched pentyl group).

Preferred examples of the cycloalkyl group as each of $R_1c$ to $R_7c$ include cycloalkyl groups having 3 to 8 carbon atoms (a cyclopentyl group and a cyclohexyl group).

The alkoxy group as each of $R_1c$ to $R_5c$ may be linear, branched, or cyclic, and examples thereof include alkoxy groups having 1 to 10 carbon atoms, and preferably linear and branched alkoxy groups having 1 to 5 carbon atoms (for example, a methoxy group, an ethoxy group, a linear or branched propoxy group, a linear or branched butoxy group, and a linear or branched pentoxy group), and cyclic alkoxy groups having 3 to 8 carbon atoms (for example, a cyclopentyloxy group and a cyclohexyloxy group).

It is preferable that any one of $R_1c$ to $R_5c$ is a linear or branched alkyl group, a cycloalkyl group, or a linear, branched, or cyclic alkoxy group, and it is more preferable that the sum of the numbers of carbon atoms of $R_1c$ to $R_5c$ is 2 to 15. Thus, the solvent solubility is more improved, and the generation of the particles during storage is suppressed.

Examples of the alkyl group as each of Rx and Ry include the same groups as the alkyl group as each of $R_1c$ to $R_7c$. The alkyl group as each of Rx and Ry is preferably a linear or branched 2-oxoalkyl group or an alkoxycarbonylmethyl group.

Examples of the cycloalkyl group as each of Rx and Ry include the same groups as the cycloalkyl group as each of $R_1c$ to $R_7c$. The cycloalkyl group as each of Rx and Ry is preferably a cyclic 2-oxoalkyl group.

Examples of the linear, branched, or cyclic 2-oxoalkyl group include the alkyl group as each of $R_1c$ to $R_7c$, and a group having >C=O at the 2-position of the cycloalkyl group.

Examples of the alkoxy group in the alkoxycarbonylmethyl group include the same groups as the alkoxy groups as $R_1c$ to $R_5c$.

Rx and Ry are each preferably an alkyl group having 4 or more carbon atoms, more preferably an alkyl group having 6 or more carbon atoms, and still more preferably an alkyl group having 8 or more carbon atoms.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and a phenyl group is more preferable.

The alkyl group as each of $R_{204}$ to $R_{207}$ may be linear or branched, and preferred examples thereof include linear or branched alkyl groups having 1 to 10 carbon atoms (for example, a methyl group, an ethyl group, a propyl group, a butyl group, and a pentyl group).

Examples of the cycloalkyl group as each of $R_{204}$ to $R_{207}$ include cycloalkyl groups having 3 to 10 carbon atoms (for example, a cyclopentyl group, a cyclohexyl group, and a norbornyl group).

$R_{204}$ to $R_{207}$ may have a substituent. Examples of the substituent that $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$X^-$ represents a non-nucleophilic anion, and examples thereof include the same ones as the non-nucleophilic anion of $X^-$ in General Formula (ZI).

Preferred examples of the compound that generates an acid upon irradiation with active light or radiation further include compounds represented by the following General Formulae (ZIV), (ZV), and (ZVI).

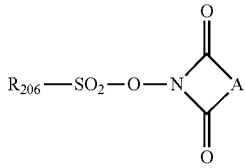

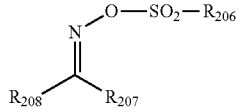

In General Formulae (ZIV) to (ZVI), $Ar_3$ and $An_4$ each independently represent an aryl group. $R_{206}$ represents an alkyl group or an aryl group. $R_{207}$ and $R_{208}$ each independently represent an alkyl group, an aryl group or electron withdrawing group. $R_{207}$ is preferably an aryl group.

$R_{208}$ is preferably an electron withdrawing group, and more preferably a cyano group or a fluoroalkyl group.

A represents an alkylene group, an alkenylene group, or arylene group.

As the compound that generates an acid upon irradiation with active light or radiation, compounds represented by General Formulae (ZI) to (ZIII) are preferable.

The compound (B) is preferably a compound that generates aliphatic sulfonic acid having a fluorine atom or benzenesulfonic acid having a fluorine atom upon irradiation with active light or radiation.

The compound (B) preferably has a triphenylsulfonium structure.

The compound (B) is preferably a triphenylsulfonium salt compound having an alkyl group or cycloalkyl group, not having a cationic moiety substituted with fluorine.

Particularly preferred ones among the compounds that generate an acid upon irradiation with active light or radiation are shown below.

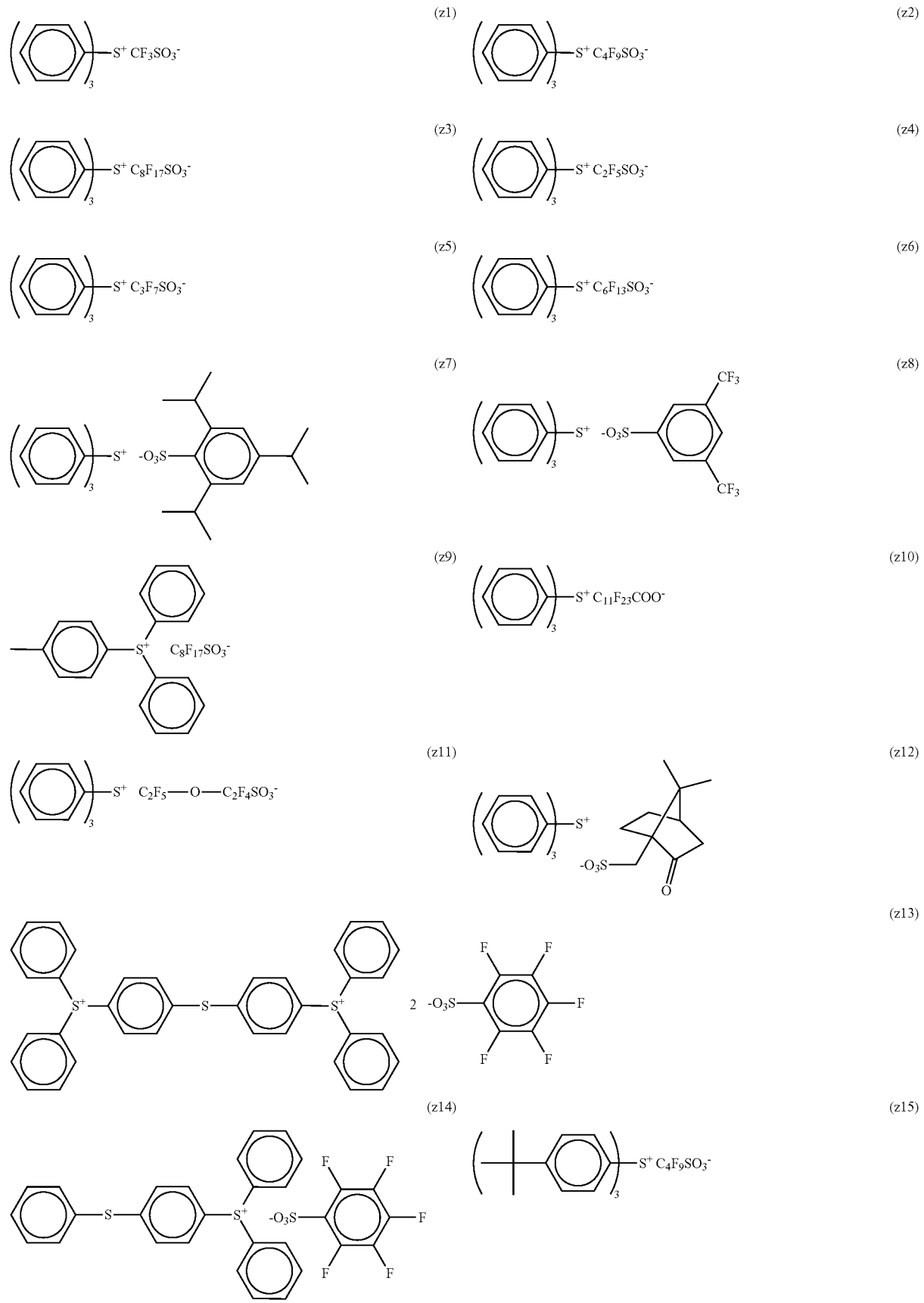

-continued
(z16)
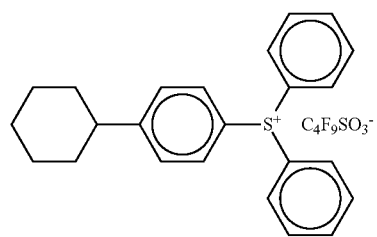
(z17)
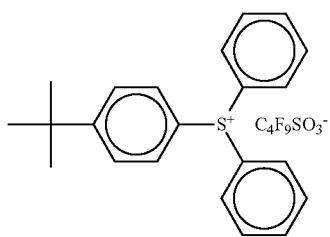
(z18)
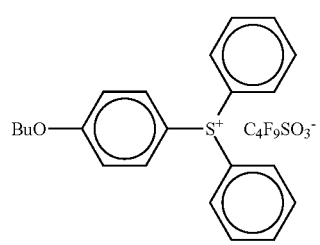
(z19)
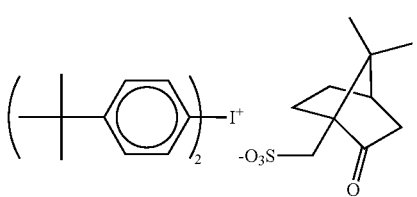
(z20)
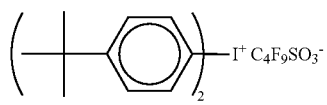
(z21)
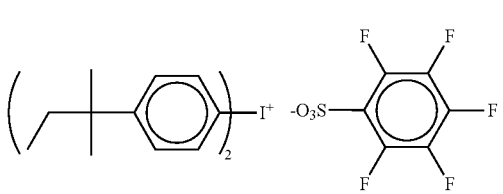
(z22)
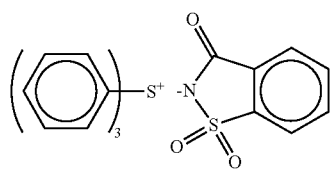
(z23)
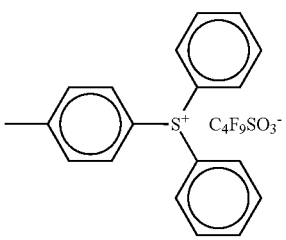
(z24)
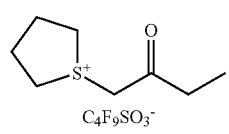
(z25)
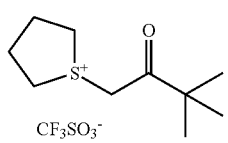
(z26)
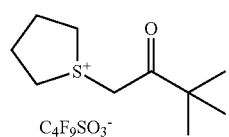
(z27)
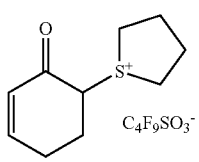
(z28)
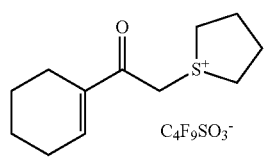
(z29)
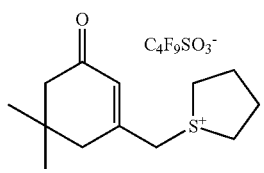

-continued
(z30) 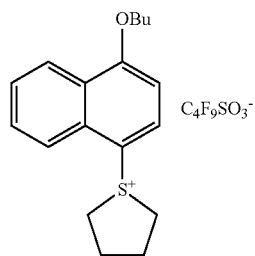
(z31) 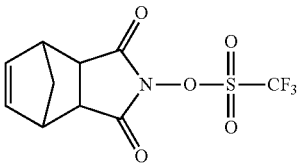
(z32) 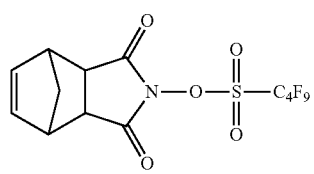
(z33) 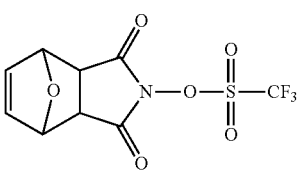
(z34) 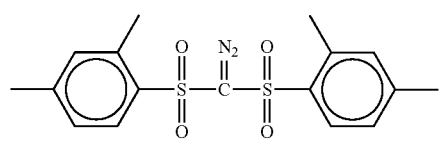
(z35) 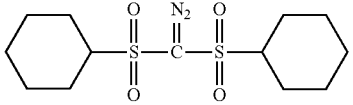
(z36) 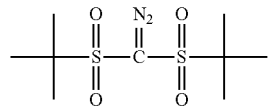
(z37) 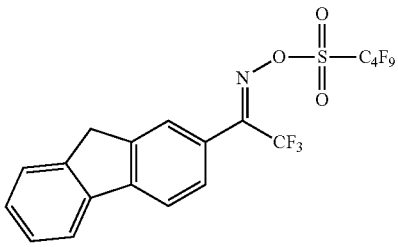
(z38) 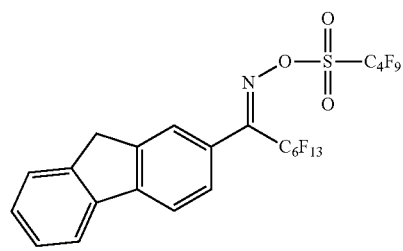
(z39) 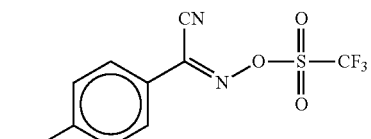
(z40) 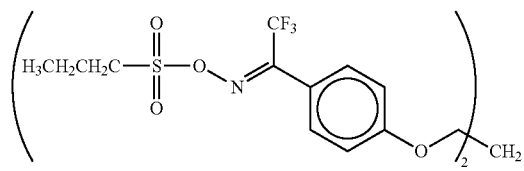
(z41) 
(z42) 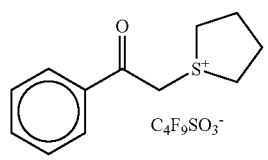
(z43) 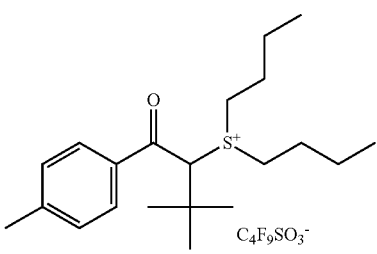

-continued
(z44)
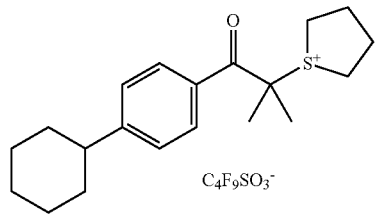
(z45)
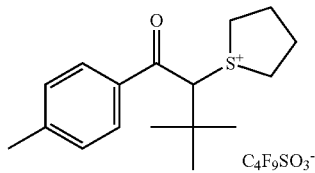
(z46)
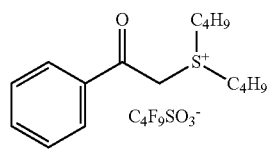
(z47)
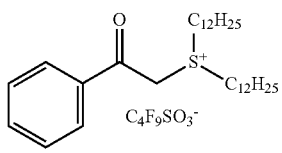
(z48)
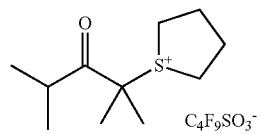
(z49)
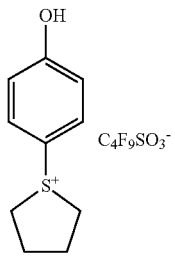
(z50)
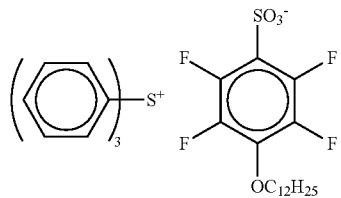
(z51)
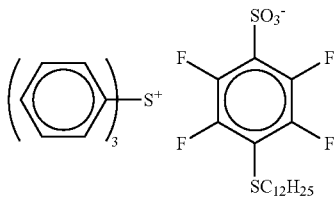
(z52)
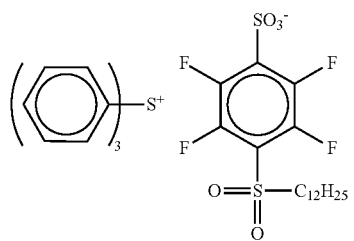
(z53)
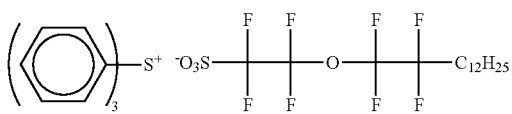
(z54)
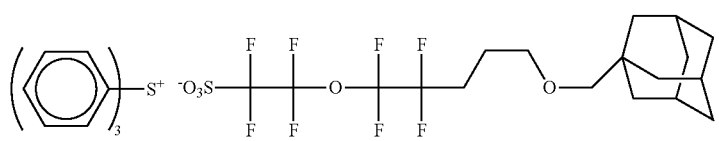
(z55)
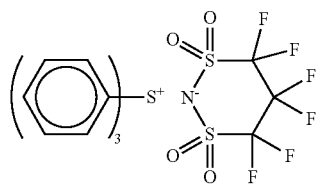
(z56)
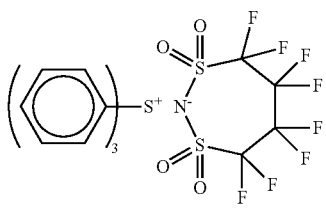

-continued
(z57)
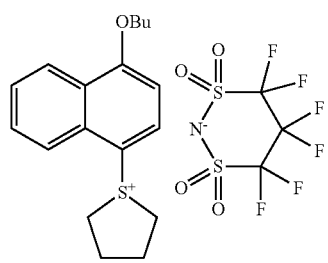
(z58)
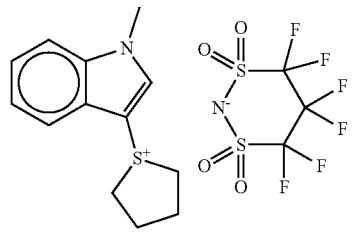
(z59)
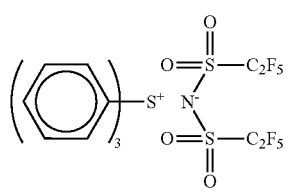
(z60)
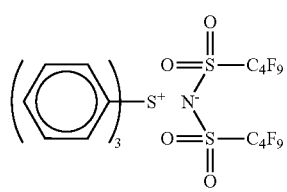
(z61)
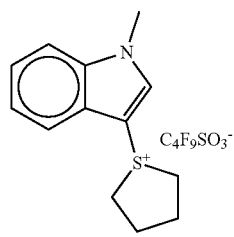
(z62)
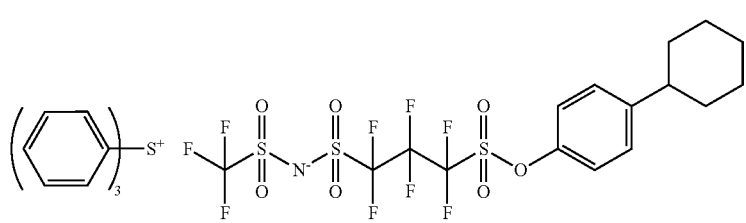
(z63)
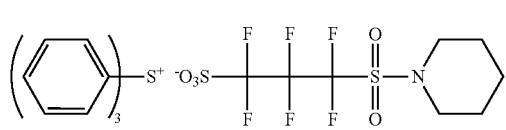
(z64)
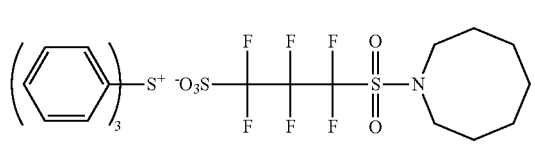
(z65)
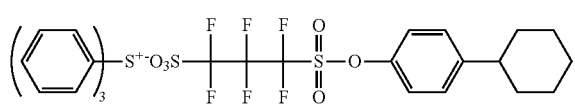
(z66)
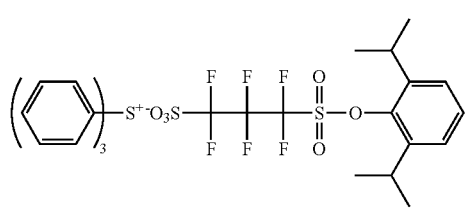
(z67)
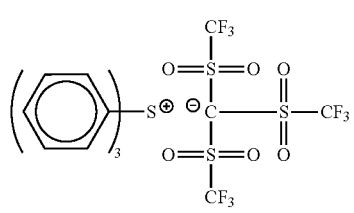
(z68)
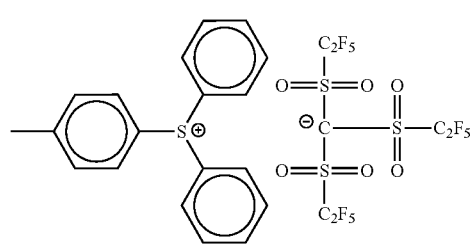

-continued
(z69) 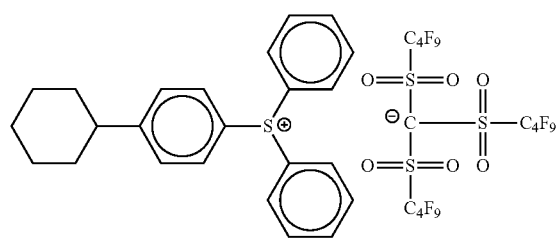
(z70) 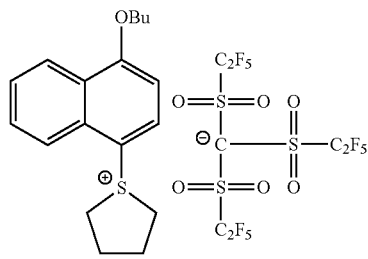
(z71) 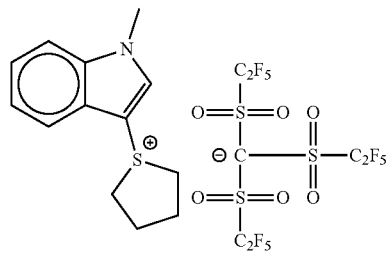
(z72) 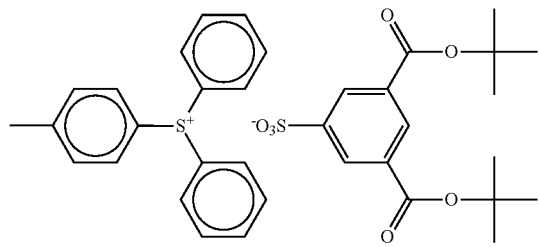
(z73) 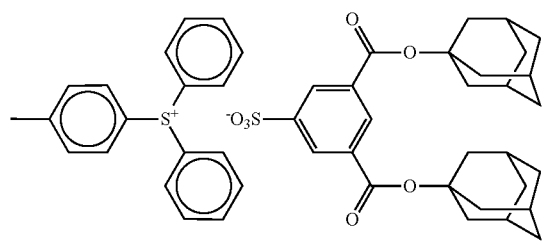
(z74) 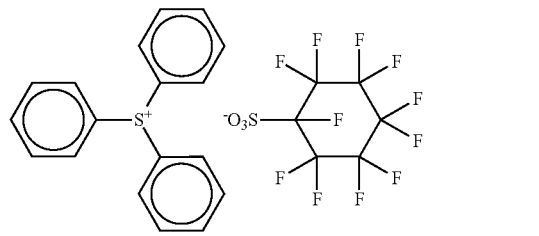
(z75) 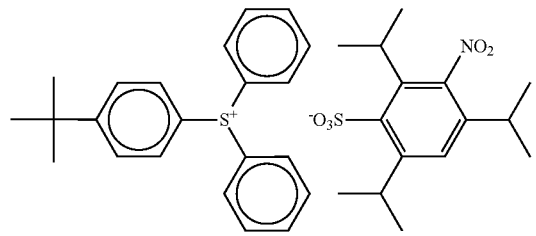
(z76) 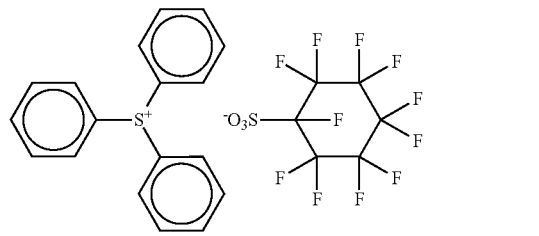
(z77) 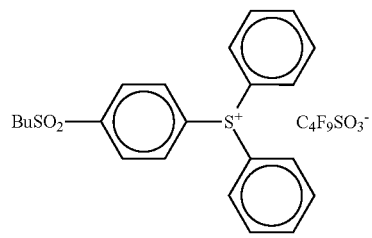
(z78) 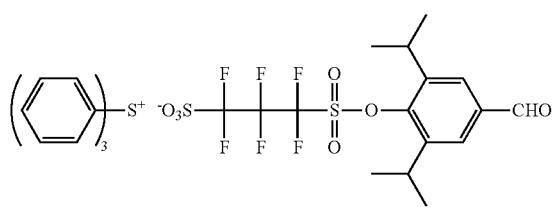
(z79) 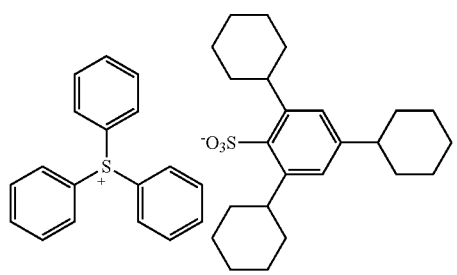

-continued

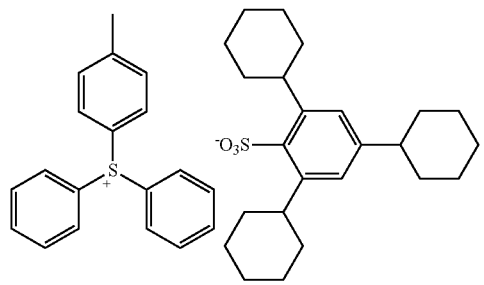
(z80)

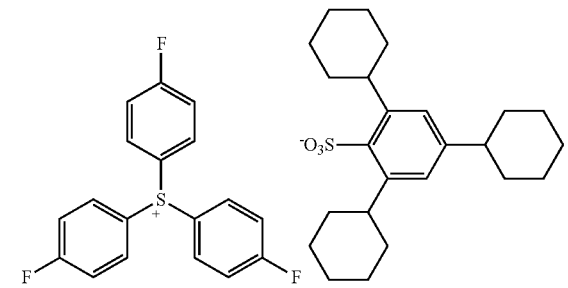
(z81)

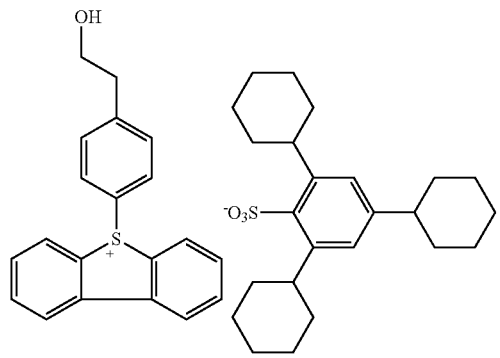
(z82)

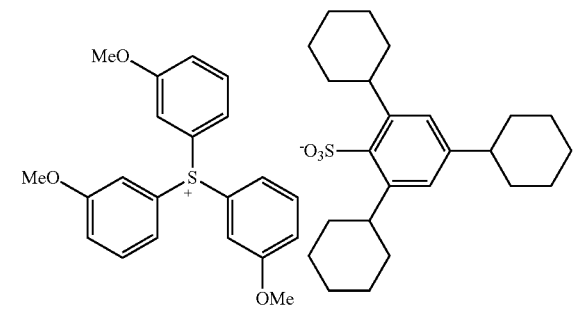
(z83)

The photoacid generator can be used singly or in combination of two or more kinds thereof. When the photoacid generator is used in combination of two or more kinds thereof, it is preferable to combine compounds that generate two different kinds of organic acids having the total number of atoms excluding hydrogen atoms of 2 or more.

The content of the photoacid generator is preferably 0.1% to 40% by mass, more preferably 0.5% to 30% by mass, and still more preferably 1% to 25% by mass, with respect to the total solid content of the resist composition.

(C) Solvent

When the respective components as described above are dissolved to prepare a resist composition, a solvent (C) can be used. Examples of the solvent which can be used include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate. Preferred examples of the alkyl alkoxy acetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

As the solvent (C), the solvents may be used singly or in combination of two or more kinds thereof.

A mixed solvent prepared by mixing a solvent containing a hydroxyl group in its structure with a solvent not containing a hydroxyl group in its structure may be used as an organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable.

Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (based on mass) of the solvents containing a hydroxyl group to the solvents not containing a hydroxyl group is preferably 1/99 to 99/1, more preferably 10/90 to 90/10, and still more preferably 20/80 to 60/40. A mixed solvent including the solvents not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Resin Having at Least One of Fluorine Atom or Silicon Atom

The resist composition may contain a resin (D) having at least one of a fluorine atom or a silicon atom.

The fluorine atom or the silicon atom in the resin (D) may be contained in the main chain of the resin or may be substituted in the side chain.

The resin (D) is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group having at least one hydrogen atom substituted with a fluorine atom, and may further have other substituents.

The cycloalkyl group having a fluorine atom is a monocyclic or polycyclic cycloalkyl group having at least one hydrogen atom substituted with a fluorine atom, and may further have other substituents.

Examples of the aryl group having a fluorine atom include those having at least one hydrogen atom of aryl groups such as a phenyl group and a naphthyl group substituted with a fluorine atom, and may further have other substituents.

Specific examples of the resin (D) are shown below, but the present invention is not limited thereto.

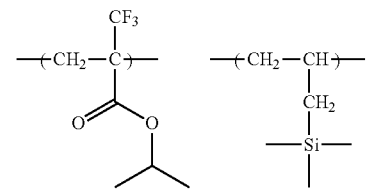

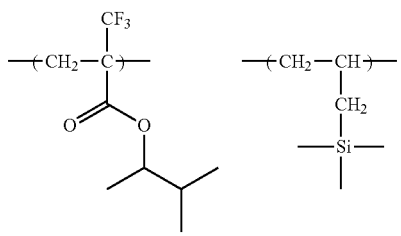

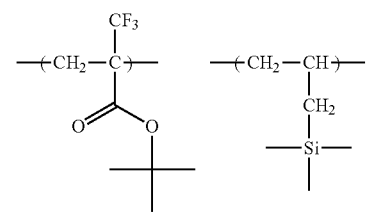

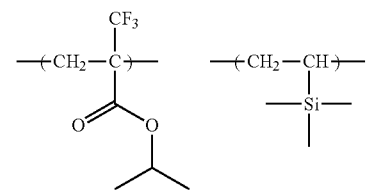

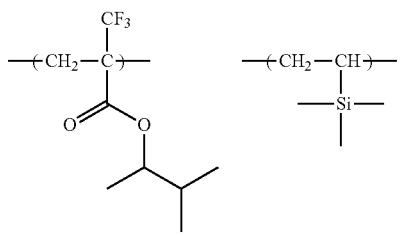

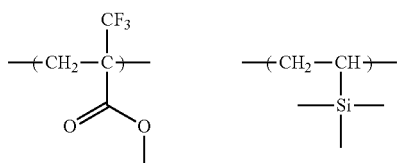

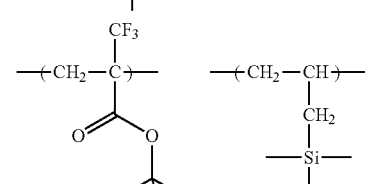

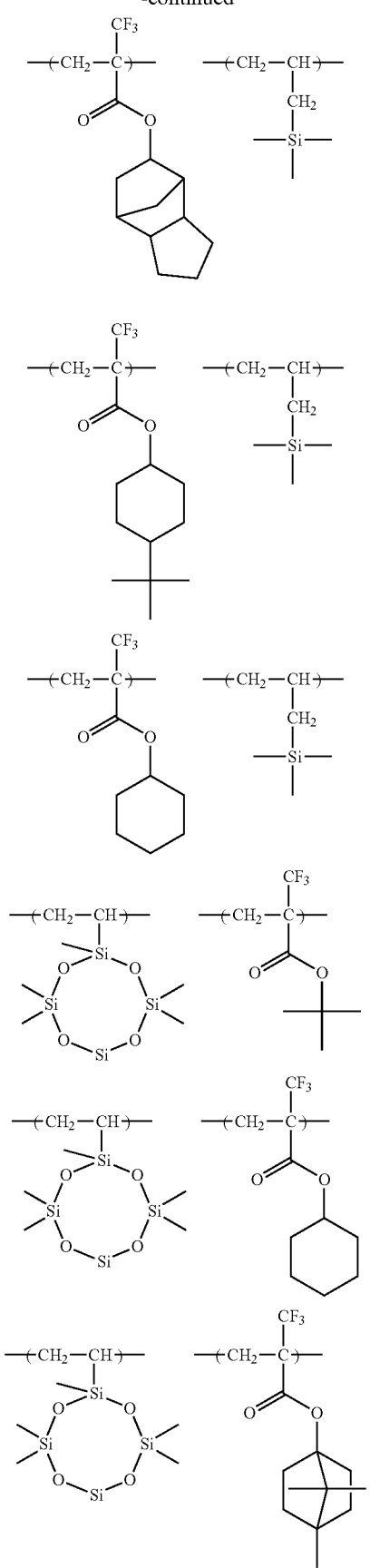
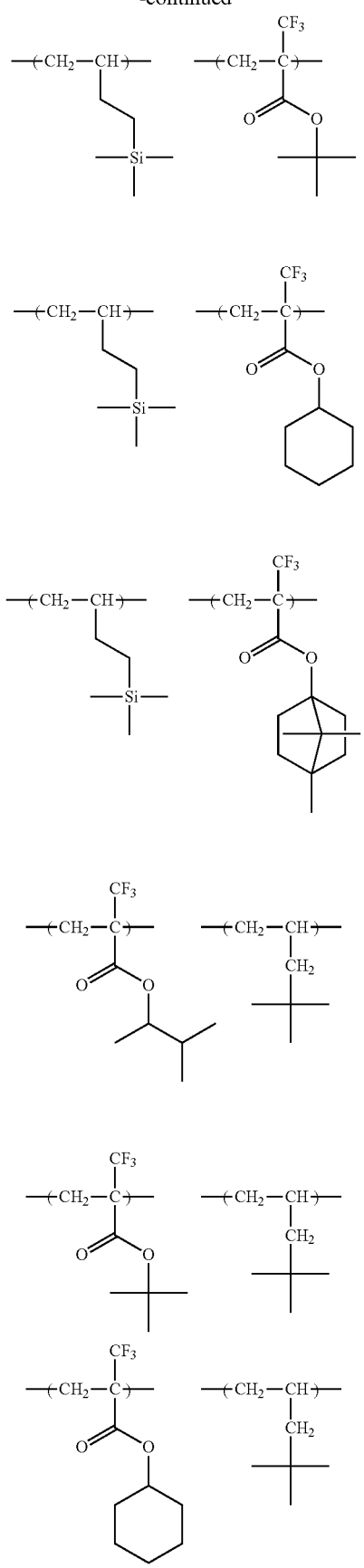

-continued

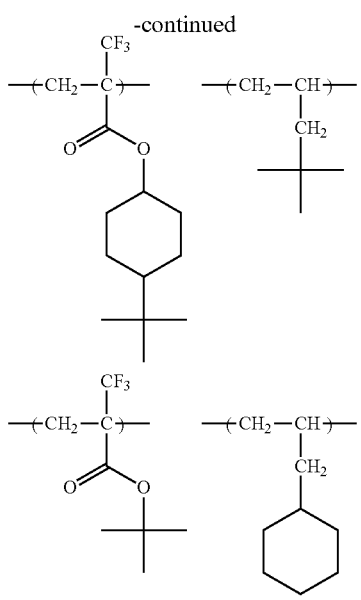

As the resin (D), various commercially available products may also be used or the resin (D) can be synthesized according to an ordinary method (for example, radical polymerization).

(E) Basic Compound

The resist composition preferably contains a basic compound (E) in order to reduce a change in performance over time from exposure to heating.

Preferred examples of the basic compound include compounds having structures represented by the following Formulae (A) to (E).

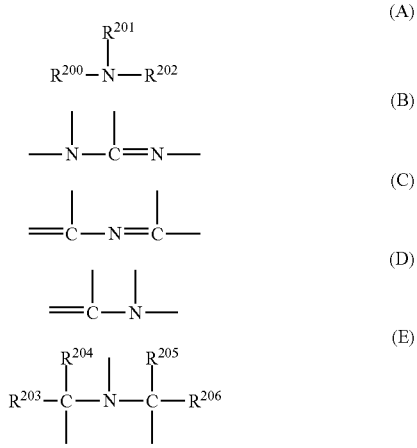

In General Formulae (A) to (E), $R^{200}$, $R^{201}$, and $R^{202}$ may be the same as or different from each other, represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris (t-butylphenyl) sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane- 1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound include an amine compound having a phenoxy group, and an ammonium salt compound having a phenoxy group.

As the amine compound, a primary, secondary, or tertiary amine compound can be used, and an amine compound in which at least one alkyl group is bonded to a nitrogen atom is preferable. The amine compound is more preferably a tertiary amine compound. Any amine compound in which a cycloalkyl group (preferably having 3 to 20 carbon atoms) or an aryl group (preferably having 6 to 12 carbon atoms) is bonded to a nitrogen atom is available as long as at least one alkyl group (preferably 1 to 20 carbon atoms), in addition to the alkyl group, is bonded to a nitrogen atom.

In addition, it is preferable that the amine compound has an oxygen atom in the alkyl chain to form an oxyalkylene group. The number of the oxyalkylene groups in a molecule is 1 or more, preferably 3 to 9, and more preferably 4 to 6. Among the oxyalkylene groups, an oxyethylene group ($—CH_2CH_2O—$) or an oxypropylene group ($—CH(CH_3)CH_2O—$ or $—CH_2CH_2CH_2O—$) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. Any ammonium salt compound in which a cycloalkyl group (preferably having 3 to 20 carbon atoms) or an aryl group (preferably having 6 to 12 carbon atoms), in addition to the alkyl group, may be bonded to a nitrogen atom is available as long as at least one alkyl group (preferably having 1 to 20 carbon atoms) is bonded to a nitrogen atom.

The ammonium salt compound preferably has an oxygen atom in the alkyl chain to form an oxyalkylene group. The number of the oxyalkylene groups in a molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

Examples of the anion of the ammonium salt compound include halogen atoms, sulfonate, borate, and phosphate, but among these, the halogen atoms and sulfonate are preferable. As the halogen atom, chloride, bromide, and iodide are particularly preferable, and as the sulfonate, organic sulfonate having 1 to 20 carbon atoms is particularly preferable. Examples of the organic sulfonate include alkyl sulfonate having 1 to 20 carbon atoms, and aryl sulfonate. The alkyl group of alkyl sulfonate may have a substituent, and examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group of the aryl sulfonate include a benzene ring, a naphthalene ring, and an anthracene ring. The benzene ring, the naphthalene ring, or the anthracene ring may have a substituent, and as the substituent, a linear or branched alkyl group having 1 to 6 carbon atoms, or cycloalkyl group having 3 to 6 carbon atoms is preferable. Specific examples of the linear or branched alkyl group, or the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound having a phenoxy group, or the ammonium salt compound having a phenoxy group means that the alkyl group of the amine compound or the ammonium salt compound has a phenoxy group at a terminal opposite to a nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group. The degree of substitution of the substituent is any one of the 2- to 6-positions. The number of the substituents may be any number in the range of 1 to 5.

At least one oxyalkylene group is preferably included between the phenoxy group and a nitrogen atom. The number of the oxyalkylene groups in a molecule is 1 or more, preferably 3 to 9, and more preferably 4 to 6. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The amine compound having a phenoxy group can be obtained by reacting a primary or secondary amine having a phenoxy group with a haloalkyl ether under heating, adding an aqueous solution of a strong base such as sodium hydroxide, potassium hydroxide, and tetraalkylammonium, and extracting the compound with an organic solvent such as ethyl acetate and chloroform. Alternatively, the compound may be obtained by reacting a primary or secondary amine with a haloalkyl ether having a phenoxy group at a terminal under heating, adding an aqueous solution of a strong base such as sodium hydroxide, potassium hydroxide, and tetraalkylammonium, and extracting the compound with an organic solvent such as ethyl acetate and chloroform.

These basic compounds may be used singly or in combination of two or more kinds thereof.

The amount of the basic compound to be used is preferably 0.001% to 10% by mass, and more preferably 0.01% to 5% by mass, with respect to the solid content of the resist composition.

The ratio between the acid generator to the basic compound to be used in the composition is preferably the acid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The acid generator/basic compound (molar ratio) is more preferably 5.0 to 200, and still more preferably 7.0 to 150.

(F) Surfactant

The resist composition can further contain a surfactant (F), and may contain either one or two or more of fluorine- and/or silicon-based surfactants (a fluorine-based surfactant, a silicon-based surfactant, or a surfactant containing both a fluorine atom and a silicon atom).

Examples of the fluorine-based and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), JP2002-277862A, U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113, F110, F177, F120, and R08 (manufactured by DIC Corp.); Surflon S-382, SC101, 102, 103, 104, 105, and 106 (manufactured by Asahi Glass Co., Ltd.); TROYSOL S-366 (manufactured by Troy Chemical Corp.); GF-300 and GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, 352, EF801, EF802, and EF601 (manufactured by JEMCO Inc.); PF636, PF656, PF6320, and PF6520 (manufactured by OMNOVA Solutions Inc.); and FTX-204D, 208G, 218G, 230G, 204D, 208D, 212D, 218, and 222D (manufactured by NEOS Co., Ltd.). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoro-aliphatic group derived from a fluoro-aliphatic compound which is produced by a telomerization method (also referred to as a telomer method) or an oligomerization method (also referred to as an oligomer method), can be used as the surfactant. The fluoro-aliphatic compound can be synthesized in accordance with the method described in JP2002-90991A.

As the polymer having a fluoro-aliphatic group, copolymer of monomers having fluoro-aliphatic groups and (poly (oxyalkylene)) acrylate and/or (poly(oxyalkylene)) methacrylate are preferable, and they may be distributed at random or may be block copolymerized. Further, examples of the poly(oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxyethylene), and poly(block combination of oxyethylene and oxypropylene). In addition, the copolymers of monomers having fluoro-aliphatic groups and (poly(oxyalkylene)) acrylate (or methacrylate) may not be only bipolymers but also terpolymers or higher polymers obtained by copolymerization of monomers having different two or more kinds of fluoro-aliphatic groups or different two or more kinds of (poly(oxyalkylene)) acrylates (or methacrylates) at the same time.

Examples of the commercially available surfactant include MEGAFACE F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, surfactants other than fluorine-based and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used singly or in combination of some kinds thereof.

The content of the surfactant in the resist composition is preferably 0.01% to 10% by mass, and more preferably 0.1% to 5% by mass, with respect to the total solid content of the resist composition.

(G) Onium Carboxylate Salt

The resist composition may contain an onium carboxylate salt (G). Examples of the onium carboxylate salt (G) include a sulfonium carboxylate salt, an iodonium carboxylate salt, and an ammonium carboxylate salt. In particular, as the onium carboxylate salt (G), an iodonium carboxylate salt and a sulfonium carboxylate salt are particularly preferable. Further, it is preferable that the carboxylate residue of the onium carboxylate salt (G) does not contain an aromatic group and a carbon-carbon double bond. As the anionic moiety, a linear, branched, monocyclic, or polycyclic alkylcarboxylate anion having 1 to 30 carbon atoms is preferable.

Further, a carboxylate anion in which a part or all of the alkyl groups are substituted with fluorine is more preferable. An oxygen atom may be contained in the alkyl chain, by which the transparency to the lights of 220 nm or less is ensured, thus, sensitivity and resolution are enhanced, and density dependency and exposure margin are improved.

Examples of the fluorine-substituted carboxylate anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, 2,2-bistrifluoromethylpropionic acid, and the like.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt in the resist composition is generally 0.1% to 20% by mass, preferably 0.5% to 10% by mass, and more preferably 1% to 7% by mass, with respect to the total solid contents of the resist composition.

(H) Hydrophobic Resin

The resist composition may contain a hydrophobic resin (hereinafter also referred to as a "hydrophobic resin (H)"). Further, the hydrophobic resin (H) is preferably different from the resin (A).

Although the hydrophobic resin (H) is preferably designed to be unevenly localized on an interface as described above, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of immersion liquid tracking properties, and inhibition of out gas.

The hydrophobic resin (H) preferably has at least one of a "fluorine atom", a "silicon atom", or a "$CH_3$ partial structure which is contained in a side chain portion of a resin" from the point of view of uneven distribution on the film surface layer, and more preferably has two or more kinds.

In a case where the hydrophobic resin (H) contains a fluorine atom and/or a silicon atom, the fluorine atom and/or the silicon atom in the hydrophobic resin (H) may be contained in the main chain or the side chain of the resin.

In a case where the hydrophobic resin (H) contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom and the aryl group having a fluorine atom are each a cycloalkyl group in which one hydrogen atom is substituted with a fluorine atom, and an aryl group having a fluorine atom, and they may further have a substituent other than a fluorine atom.

Preferred examples of the alkyl group having a fluorine atom, the cycloalkyl group having a fluorine atom, and the aryl group having a fluorine atom include groups represented by the following General Formulae (F2) to (F4), but the present invention is not limited thereto.

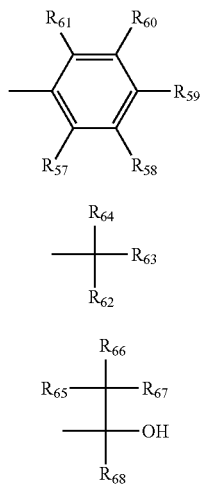

In General Formulae (F2) to (F4), $R_{57}$ to $R_{68}$ each independently represent a hydrogen atom, a fluorine atom, or an (linear or branched) alkyl group, provided that at least one of $R_{57}, \ldots,$ or $R_{61}$, at least one of $R_{62}, \ldots,$ or $R_{64}$, and at least one of $R_{65}, \ldots,$ or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

The hydrophobic resin (H) may contain a silicon atom. It is preferably a resin having an alkylsilyl structure (preferably a trialkylsilyl group) or a cyclic siloxane structure as a partial structure having a silicon atom.

Examples of the repeating unit having a fluorine atom or a silicon atom include those exemplified in [0519] of US2012/0251948A1.

Furthermore, it is also preferable that the hydrophobic resin (H) contains a $CH_3$ partial structure in the side chain portion, as described above.

Here, the $CH_3$ partial structure (hereinafter also simply referred to as a "side chain $CH_3$ partial structure") contained in the side chain portion in the hydrophobic resin (H) includes a $CH_3$ partial structure contained in an ethyl group, a propyl group, and the like.

On the other hand, a methyl group bonded directly to the main chain of the hydrophobic resin (H) (for example, an α-methyl group in the repeating unit having a methacrylic acid structure) makes only a small contribution of uneven distribution to the surface of the hydrophobic resin (H) due to the effect of the main chain, and it is therefore not included in the "$CH_3$ partial structure" as described above.

More specifically, in a case where the hydrophobic resin (H) contains a repeating unit derived from a monomer having a polymerizable moiety with a carbon-carbon double bond, such as a repeating unit represented by the following General Formula (M), and in addition, $R_{11}$ to $R_{14}$ are $CH_3$ "themselves", such $CH_3$ is not included in the $CH_3$ partial structure contained in the side chain portion.

On the other hand, a $CH_3$ partial structure which is present via a certain atom from a C—C main chain corresponds to the "side chain $CH_3$ partial structure". For example, in a case where $R_{11}$ is an ethyl group ($CH_2CH_3$), the hydrophobic resin has "one" $CH_3$ partial structure.

In General Formula (M), $R_{11}$ to $R_{14}$ each independently represent a side chain portion. Examples of $R_{11}$ to $R_{14}$ in the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin (H) is preferably a resin including a repeating unit having the $CH_3$ partial structure in the side chain portion thereof. Further, the hydrophobic resin more preferably has, as such a repeating unit, at least one repeating unit (x) of a repeating unit represented by the following General Formula (II) or a repeating unit represented by the following General Formula (III).

Hereinafter, the repeating unit represented by General Formula (II) will be described in detail.

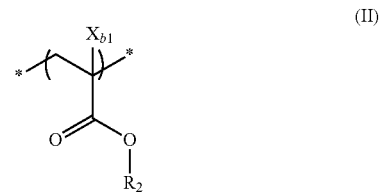

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, more specifically, the organic group which is stable against an acid is preferably an organic group which does not have an acid-decomposable group.

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. The cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, which has one or more $CH_3$ partial structures.

The number of the $CH_3$ partial structures contained in the organic group which has one or more $CH_3$ partial structures and is stable against an acid as $R_2$ is preferably 2 to 10, and more preferably 2 to 8.
Specific preferred examples of the repeating unit represented by General Formula (II) are shown below, but the present invention is not limited thereto.
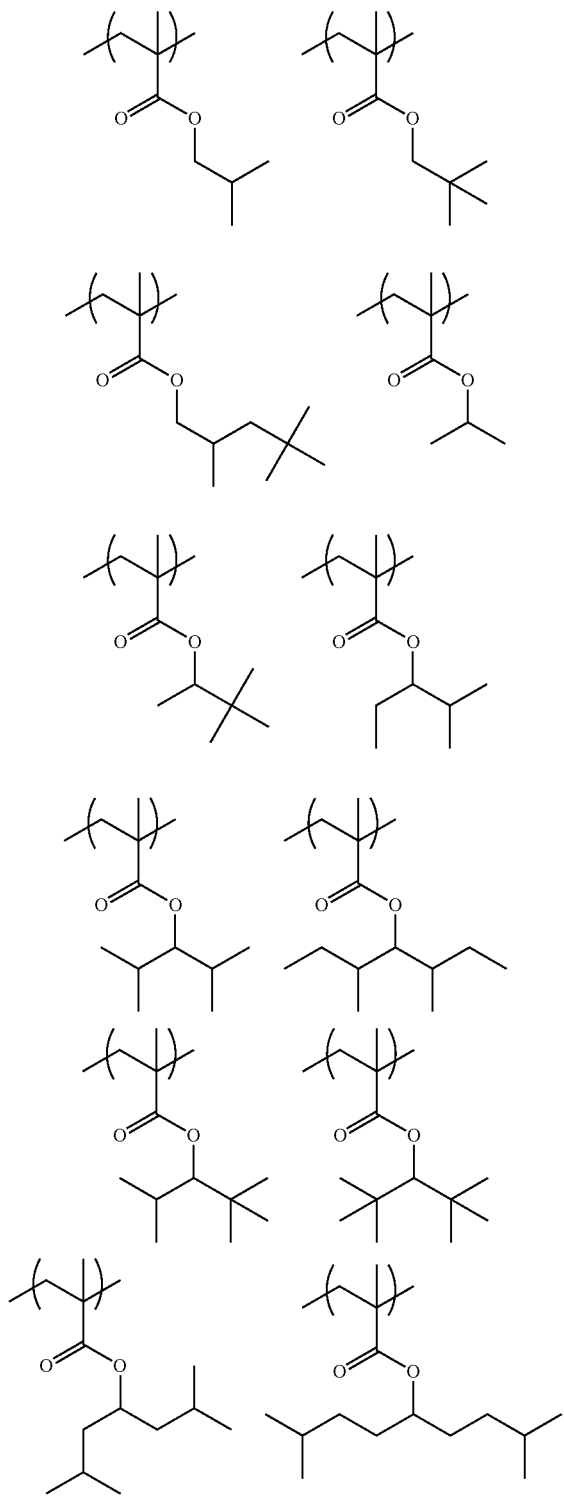
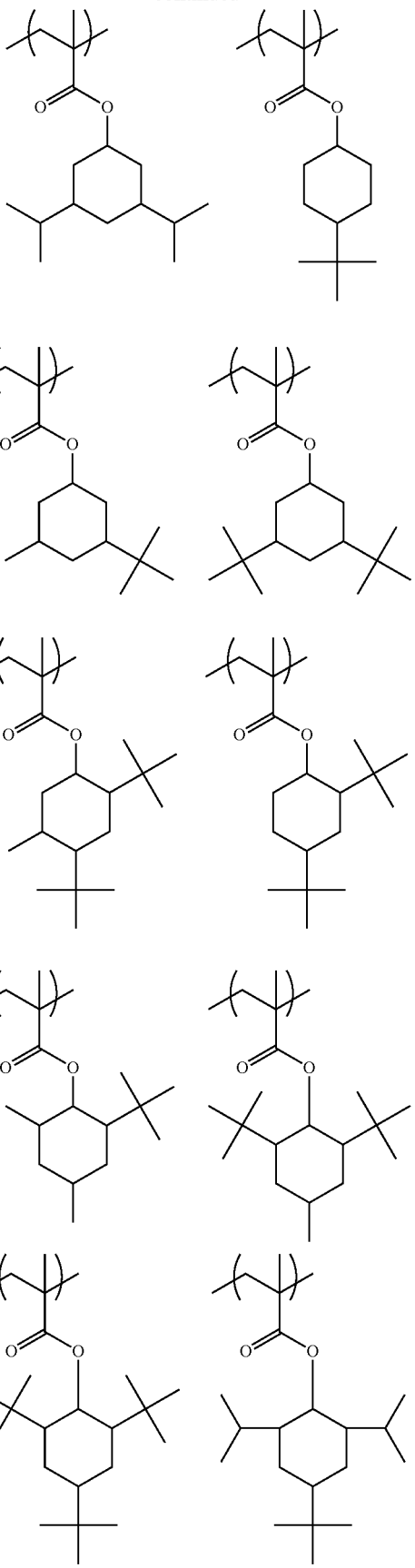
-continued

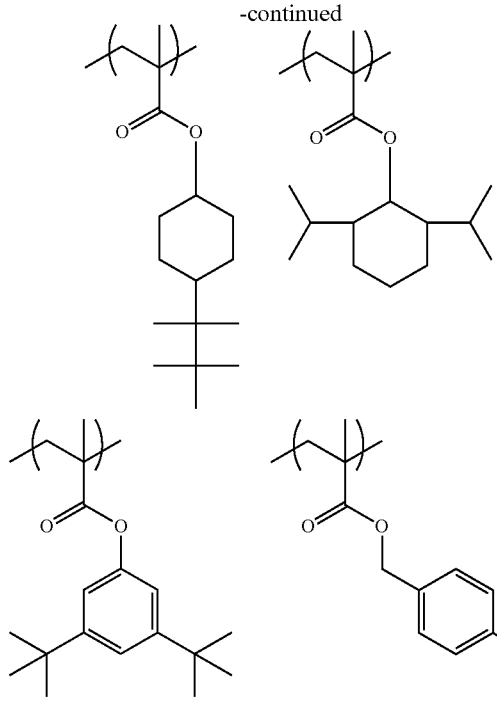

The repeating unit represented by General Formula (II) is preferably a repeating unit which is stable against an acid (acid-indecomposable), and specifically, it is preferably a repeating unit not having a group that decomposes by the action of an acid to generate a polar group.

Hereinafter, the repeating unit represented by General Formula (III) will be described in detail.

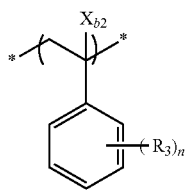

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group stable against an acid, more specifically, $R_3$ is preferably an organic group which does not have the acid-decomposable group.

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, preferably an integer of 1 to 3, and more preferably 1 or 2.

Specific preferred examples of the repeating unit represented by General Formula (III) are shown below, but the present invention is not limited thereto.

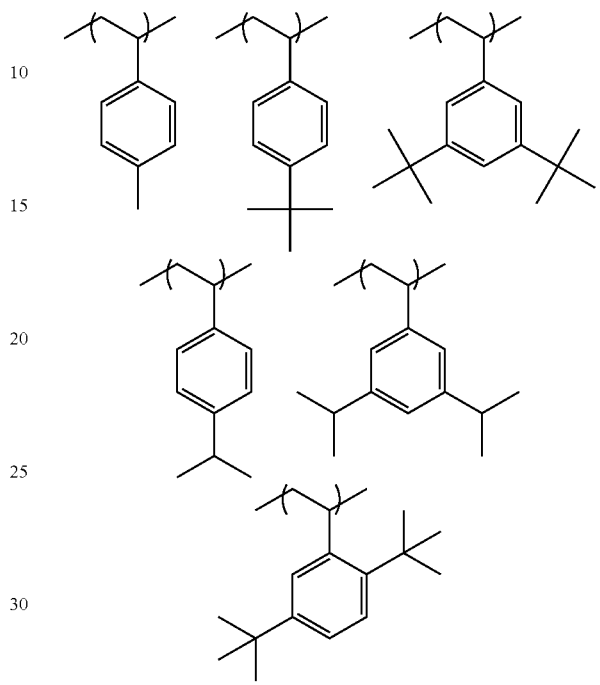

The repeating unit represented by General Formula (III) is preferably a repeating unit which is stable against an acid (acid-indecomposable), and specifically, it is preferably a repeating unit which does not have a group that decomposes by the action of an acid to generate a polar group.

In a case where the hydrophobic resin (H) contains a $CH_3$ partial structure in the side chain portion thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin (H). Further, the content is usually 100% by mole or less with respect to all the repeating units of the hydrophobic resin (H).

By incorporating at least one repeating unit (x) of the repeating unit represented by General Formula (II) or the repeating unit represented by General Formula (III) in a proportion of 90% by mole or more with respect to all the repeating units of the hydrophobic resin (H) into the hydrophobic resin (H), the surface free energy of the hydrophobic resin (H) is increased. As a result, it is difficult for the hydrophobic resin (H) to be unevenly distributed on the surface of the resist film and the static/dynamic contact angle of the resist film with respect to water can be securely increased, thereby enhancing the immersion liquid tracking properties.

In addition, in a case where the hydrophobic resin (H) contains (i) a fluorine atom and/or a silicon atom or (ii) a $CH_3$ partial structure in the side chain moiety, the hydrophobic resin (H) may have at least one group selected from the following groups (x) to (z):

(x) an acid group,
(y) a group having a lactone structure, an acid anhydride group, or an acid imido group, and
(z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit containing an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom or a silicon atom.

The content of the repeating units having an acid group (x) is preferably 1% to 50% by mole, more preferably 3% to 35% by mole, and still more preferably 5% to 20% by mole, with respect to all the repeating units in the hydrophobic resin (H).

Specific preferred examples of the repeating unit having an acid group (x) are shown below, but the present invention is not limited thereto. In the formulae, Rx represents a hydrogen atom, $CH_3$, $CF_3$, or $CH_2OH$.

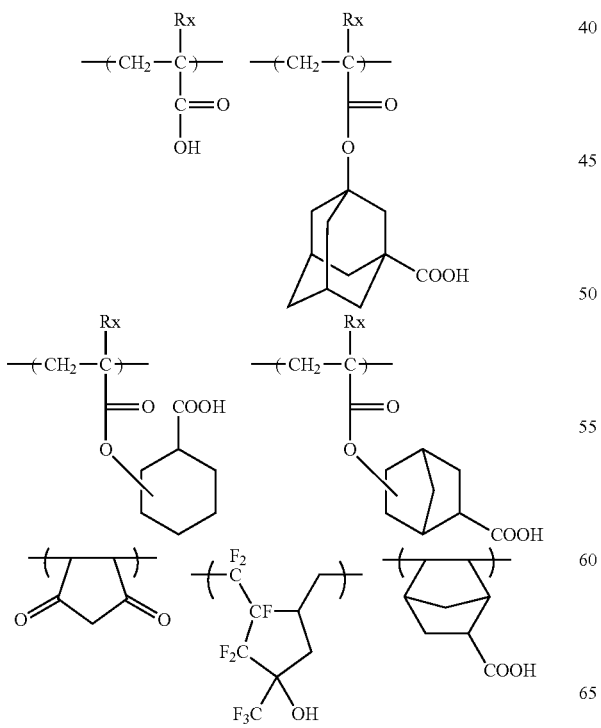

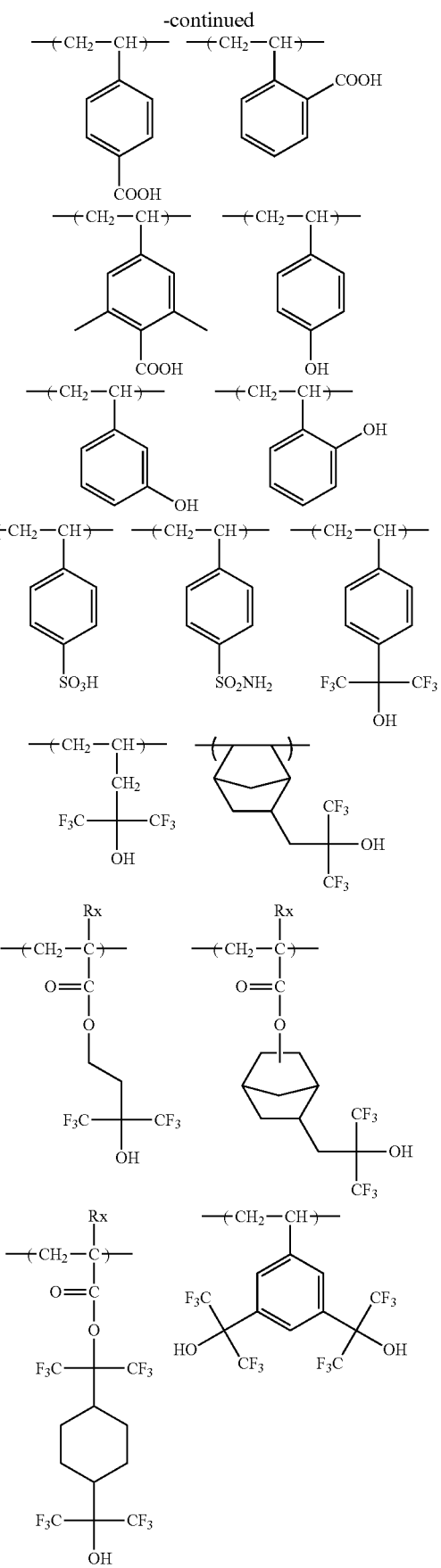

-continued

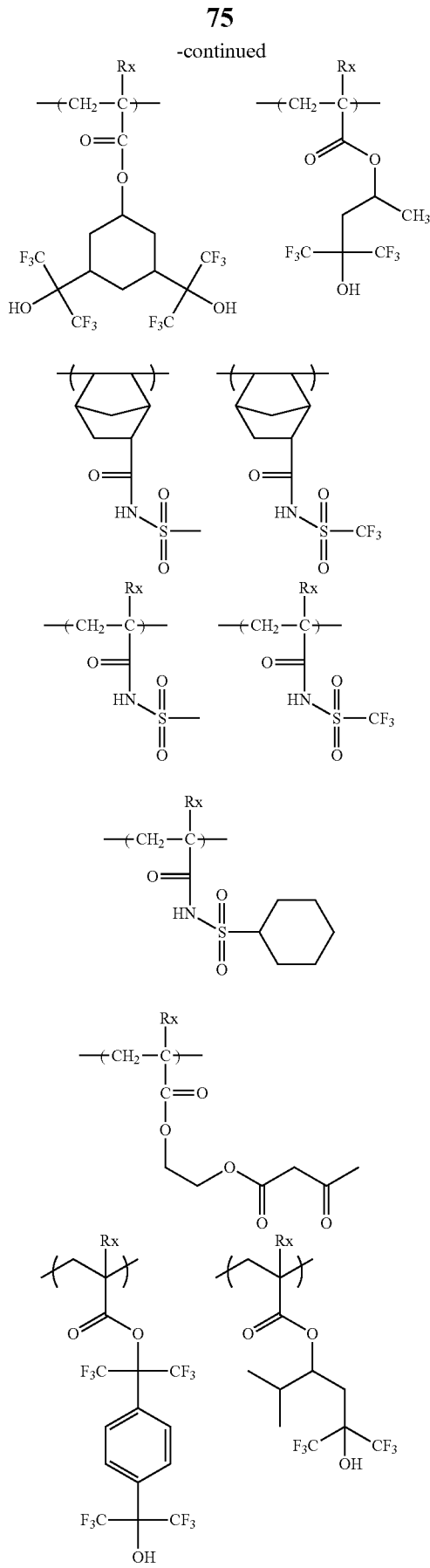
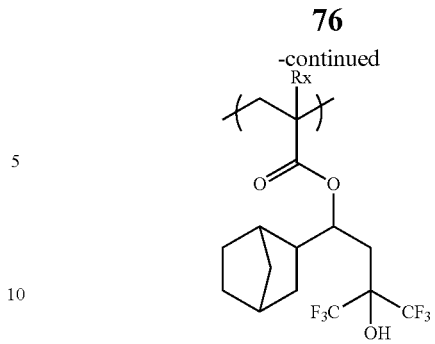

As the group having a lactone structure, the acid anhydride group, or the acid imido group (y), a group having a lactone structure is particularly preferable.

The repeating unit containing such a group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively this repeating unit may be introduced into the terminal of the resin by using a polymerization initiator or chain transfer agent containing the group during the polymerization.

Examples of the repeating unit containing a group having a lactone structure include the same ones as the repeating unit having a lactone structure as described earlier in the section of the resin (A).

The content of the repeating units containing a group having a lactone structure, an acid anhydride group, or an acid imido group (y) is preferably 1% to 100% by mole, more preferably 3% to 98% by mole, and still more preferably 5% to 95% by mole, with respect to all the repeating units in the hydrophobic resin (H).

With respect to the hydrophobic resin (H), examples of the repeating unit having a group (z) that decomposes by the action of an acid include the same ones as the repeating units having a group that decomposes by the action of an acid to generate a carboxyl group, exemplified as the resin (A), but are not limited thereto. The repeating unit having a group (z) that decomposes by the action of an acid may have at least one of a fluorine atom or a silicon atom. For the hydrophobic resin (H), the content of the repeating units having a group (z) that decomposes by the action of an acid is preferably 1% to 80% by mole, more preferably 10% to 80% by mole, and still more preferably 20% to 60% by mole, with respect to all the repeating units in the hydrophobic resin (H).

The hydrophobic resin (H) may further have repeating units that are different from the repeating units as described above.

The content of the repeating units having a fluorine atom is preferably 10% to 100% by mole, and more preferably 30% to 100% by mole, with respect to all the repeating units included in the hydrophobic resin (H). Further, the content of the repeating units having a silicon atom is preferably 10% to 100% by mole, and more preferably 20% to 100% by mole, with respect to all the repeating units included in the hydrophobic resin (H).

On the other hand, in particular, in a case where the hydrophobic resin (H) contains a $CH_3$ partial structure in the side chain moiety thereof, it is also preferable that the hydrophobic resin (H) has a form not having substantially a fluorine atom and a silicon atom. In addition, it is preferable that the hydrophobic resin (H) is composed substantially of a repeating unit constituted with only an atom selected from a carbon atom, an oxygen atom, a hydrogen atom, a nitrogen atom, and a sulfur atom.

The weight-average molecular weight of the hydrophobic resin (H) in terms of standard polystyrene is preferably 1,000 to 100,000, and more preferably 1,000 to 50,000.

Furthermore, the hydrophobic resins (H) may be used singly or in combination of two or more kinds thereof.

The content of the hydrophobic resins (H) in the composition is preferably 0.01% to 10% by mass, and more preferably 0.05% to 8% by mass, with respect to the total solid content of the composition.

In the hydrophobic resin (H), the content of residual monomers or oligomer components is also preferably 0.01% to 5% by mass, and more preferably 0.01% to 3% by mass. Further, the molecular weight distribution (Mw/Mn, also referred to as a dispersity) is preferably in the range of 1 to 5, and more preferably in the range of 1 to 3.

As the hydrophobic resin (H), various commercial products may be used, or the resin may be synthesized by an ordinary method (for example, radical polymerization).

(I) Other Additives

The resist composition may further contain a dye, a plasticizer, a light sensitizer, a light absorbent, an alkali-soluble resin, a dissolution inhibitor, a compound promoting solubility in a developer (for example, a phenol compound with a molecular weight of 1,000 or less, an alicyclic or aliphatic compound having a carboxyl group), and the like, if necessary.

Such a phenol compound having a molecular weight of 1,000 or less may be easily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but are not limited to, a carboxylic acid derivative having a steroid structure such as cholic acid, deoxycholic acid, and lithocholic acid, an adamantane carboxylic acid derivative, adamantane dicarboxylic acid, cyclohexane carboxylic acid, and cyclohexane dicarboxylic acid.

EXAMPLES

Hereinafter, the present invention will be described with reference to Examples, but the present invention is not limited thereto.

<Resin (A)>

(Synthesis Example 1) Synthesis of Resin (A-1) 600 g of cyclohexanone was put into a 2 L flask, and replaced with nitrogen at a flow rate of 100 mL/min for 1 hour. Thereafter, 4.60 g (0.02 mol) of a polymerization initiator V-601 (manufactured by Wako Pure Chemical Industries, Ltd.) was added thereto, and the mixture was warmed until the internal temperature reached 80° C. Next, the following monomers and 4.60 g (0.02 mol) of the polymerization initiator V-601 (manufactured by Wako Pure Chemical Industries, Ltd.) were dissolved in 200 g of cyclohexanone to prepare a monomer solution. The monomer solution was added dropwise into the flask heated to 80° C. for 6 hours. After dropwise addition, the solution was further allowed to undergo a reaction at 80° C. for 2 hours.

| 4-Acetoxystyrene | 48.66 g (0.3 mol) |
| 1-Ethylcyclopentyl methacrylate | 109.4 g (0.6 mol) |
| Monomer 1 | 22.2 g (0.1 mol) |

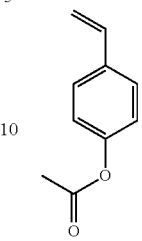

4-Acetoxystyrene

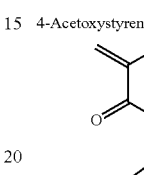

1-Ethylcyclopentyl methacrylate

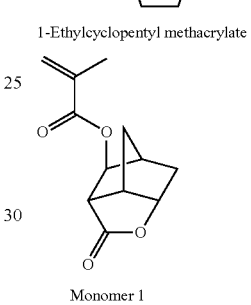

Monomer 1

The reaction solution was cooled to room temperature, and added dropwise to 3 L of hexane to precipitate a polymer. The precipitated polymer was filtered and the obtained solid was dissolved in 500 mL of acetone. Subsequently, this solution was again added dropwise to 3 L of hexane and then filtered, and the obtained solid was dried under reduced pressure to obtain 160 g of a 4-acetoxystyrene/1-ethylcyclopentyl methacrylate/monomer 1 copolymer (A-1a).

10 g of the copolymer (A-1a) obtained above, 40 mL of methanol, 200 mL of 1-methoxy-2-propanol, and 1.5 mL of concentrated hydrochloric acid were added into a reaction container, and the mixture was heated at 80° C. and stirred for 5 hours. The reaction solution was left to be cooled to room temperature, added dropwise to 3 L of distilled water, and then filtered. The obtained solid was dissolved in 200 mL of acetone, added dropwise to 3 L of distilled water, and then filtered, and the obtained solid was dried under reduced pressure to obtain a resin (A-1) (8.5 g). The weight-average molecular weight determined by GPC was 10,800, and the molecular weight dispersity (Mw/Mn) was 1.55.

By the same method as in Synthesis Example 1 except for changing the monomers to be used, resins (A-2) to (A-5) having the structures shown in Table 1 were synthesized. The compositional ratios (molar ratios) of the resins were calculated by measurement using $^1$H-NMR. The weight-average molecular weights (Mw: in terms of polystyrene) and the dispersities (Mw/Mn) of the resins were calculated by measurement using GPC (solvent: THF).

TABLE 1
| Structure | | | | Compositional ratio (molar ratio) | Mw | Mw/Mn |
|---|---|---|---|---|---|---|
| Resin A-1 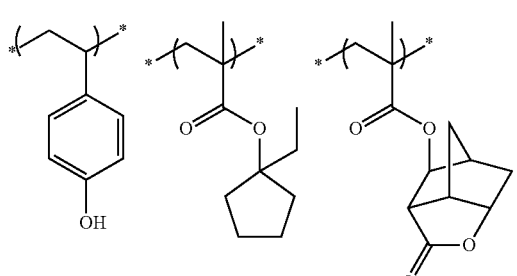 | | | | 30/60/10 | 10,800 | 1.55 |
| Resin A-2 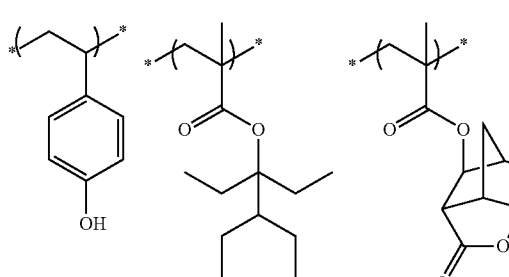 | | | | 30/55/15 | 9,500 | 1.56 |
| Resin A-3 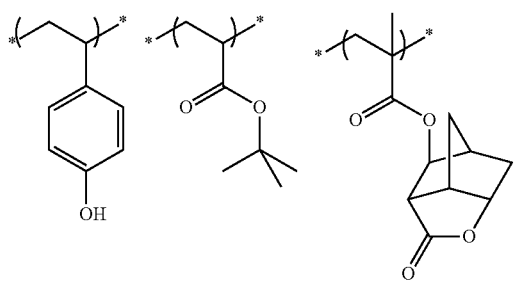 | | | | 30/60/20 | 10,100 | 1.55 |
| Resin A-4 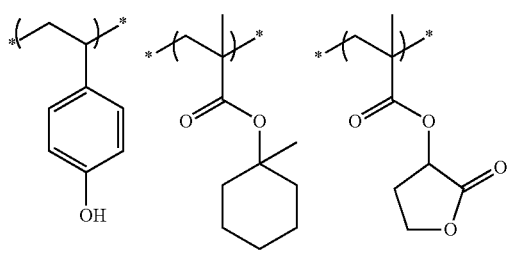 | | | | 30/50/20 | 9,800 | 1.58 |
| Resin A-5 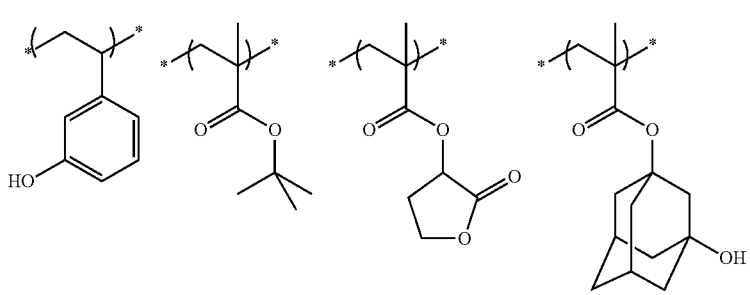 | | | | 20/50/20/10 | 8,500 | 1.65 |

<Acid Generator (B)>

As the acid generator, the following ones were used.

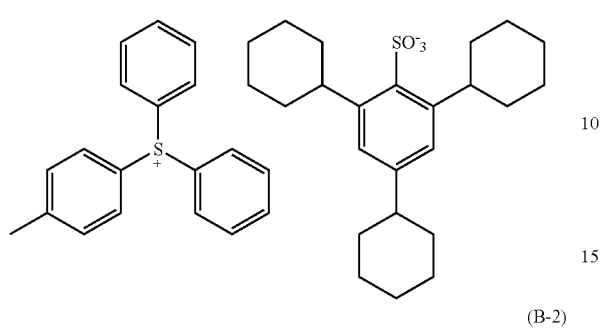

(B-1)

(B-2)

(B-3)

<Basic Compound (E)>

As the basic compound, the following ones were used.

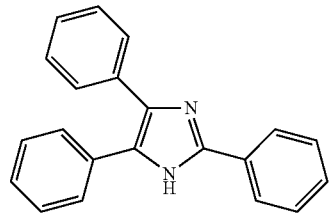

(E-1)

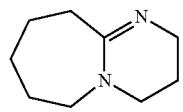

(E-2)

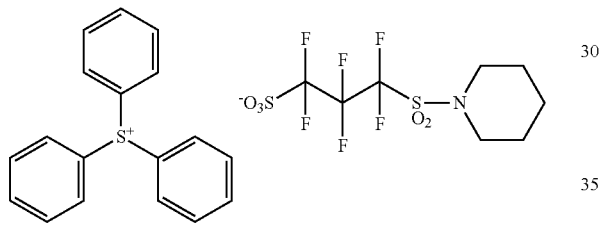

(E-3)

<Solvent (C)>

As the resist solvent, the following ones were used.

C-1: Propylene glycol monomethyl ether acetate
C-2: Propylene glycol
C-3: Ethyl lactate
C-4: Cyclohexanone

<Other Additives>

As such other additives, the following ones were used.

Additive 1: 2-Hydroxy-3-naphthoic acid

Additive 2: Surfactant PF6320 (manufactured by OMNOVA Solutions Inc.)

<Resist Composition>

The respective components shown in Table 2 below were dissolved in the solvents shown in the same table. These were filtered using a polyethylene filter having a pore size of 0.03 μm to obtain a resist composition.

TABLE 2

|  | Resin (A) | Acid generator (B) | Basic compound (E) | Solvent (C) | | Other additives |
|---|---|---|---|---|---|---|
| Resist composition 1 | A-1 | B-3 | E-3 | C-1 | C-3 | |
|  | 0.78 g | 0.19 g | 0.03 g | 67.5 g | 7.5 g | |
| Resist composition 2 | A-2 | B-1 | E-1 | C-1 | C-4 | |
|  | 0.77 g | 0.2 g | 0.03 g | 45 g | 30 g | |
| Resist composition 3 | A-3 | B-2 | E-1 | C-1 | C-3 | |
|  | 0.79 g | 0.18 g | 0.03 g | 67.5 g | 7.5 g | |
| Resist composition 4 | A-4 | B-2 | E-2 | C-1 | C-2 | |
|  | 0.81 g | 0.18 g | 0.01 g | 60 g | 15 g | |
| Resist composition 5 | A-5 | B-3 | E-1 | C-1 | C-4 | Additive 2 |
|  | 0.78 g | 0.19 g | 0.03 g | 30 g | 45 g | 0.01 g |

TABLE 2-continued

| | Resin (A) | Acid generator (B) | Basic compound (E) | Solvent (C) | | Other additives |
|---|---|---|---|---|---|---|
| Resist composition 6 | A-1 0.77 g | B-1 0.2 g | E-1 0.03 g | C-1 45 g | C-4 30 g | Additive 1 0.03 g |

<Evaluation of EB Exposure>

Examples 1 to 10, and Comparative Examples 1 to 3

Resist patterns were formed by the following procedure, using the resist compositions 1 to 6 described in Table 2. The details for forming the resist patterns are shown in Table 3.

[Coating and Post-Coating Bake of Resist Composition]

An organic film DUV44 (manufactured by Brewer Science, Inc.) was coated on a 6-inch silicon wafer, and baked at 200° C. for 60 seconds to form an organic film having a film thickness of 60 nm. The resist composition described in Table 2 was coated thereon, and baked (post-coating bake) under the conditions described in Table 3 to form a resist film having a film thickness of 40 nm.

[Exposure]

The wafer on which the resist film had been formed was exposed with a change in the exposure dose, by means of an an electron beam irradiating device (JBX6000FS/E, manufactured by JEOL Ltd.; acceleration voltage of 50 KeV) to form a 20 nm to 15 nm line-and-space pattern (lengthwise 0.12 mm, 20 drawn lines) at 1.25 nm intervals.

[Post-Exposure Bake]

After the irradiation, the film was taken out from the electron beam irradiating device, and immediately heated (post-exposure baked) on a hot plate under the conditions specified in Table 3.

[Development]

By means of a shower type developing device (ADE3000S, manufactured by Actes Kyosan, Inc.), development was carried out by spray-charging the developer (23° C.) described in Table 3 at a flow rate of 200 mL/min for a predetermined period of time while rotating the wafer at 50 rotations (rpm).

Thereafter, a rinsing treatment was carried out by spray-charging the rising liquid (23° C.) described in Table 3 at a flow rate of 200 mL/min for a predetermined period of time while rotating the wafer at 50 rotations (rpm).

Lastly, the wafer was dried by rotating at a high speed of 2,500 rotations (rpm) for 60 seconds.

TABLE 3

| | Resist composition | Post-coating bake | Post-exposure bake | Developer | Rinsing liquid |
|---|---|---|---|---|---|
| Example 1 | 1 | 120° C. × 60 seconds | 110° C. × 60 seconds | S-3 | — |
| Example 2 | 2 | 120° C. × 60 seconds | 110° C. × 60 seconds | S-4 | S-6 |
| Example 3 | 3 | 120° C. × 60 seconds | 110° C. × 60 seconds | S-4 | S-7 |
| Example 4 | 4 | 120° C. × 60 seconds | 110° C. × 60 seconds | S-5 | S-7 |
| Example 5 | 5 | 120° C. × 60 seconds | 110° C. × 60 seconds | S-4 | S-7 |
| Example 6 | 6 | 120° C. × 60 seconds | 110° C. × 60 seconds | S-4 | S-7 |
| Example 7 | 2 | 120° C. × 60 seconds | 110° C. × 60 seconds | S-9 | S-7 |
| Example 8 | 1 | 120° C. × 60 seconds | 110° C. × 60 seconds | S-4 | — |
| Example 9 | 1 | 120° C. × 60 seconds | 110° C. × 60 seconds | S-3 | S-8 |
| Example 10 | 3 | 120° C. × 60 seconds | 110° C. × 60 seconds | S-3 | S-7 |
| Comparative Example 1 | 1 | 120° C. × 60 seconds | 110° C. × 60 seconds | S-1 | — |
| Comparative Example 2 | 1 | 120° C. × 60 seconds | 110° C. × 60 seconds | S-2 | S-7 |
| Comparative Example 3 | 3 | 120° C. × 60 seconds | 110° C. × 60 seconds | S-1 | — |

The developers and the rinsing liquids described in Table 3 are shown below.

S-1: Butyl acetate
S-2: Pentyl acetate
S-3: Hexyl acetate
S-4: Butyl butanoate
S-5: Hexyl propionate
S-6: Decane
S-7: Undecane
S-8: Isopropyl alcohol
S-9: Butyl pentanoate With respect to the following items, evaluation of the resist pattern was carried out. Details of the results are shown in Table 4.

[Sensitivity]

The obtained pattern was observed by means of a scanning electron microscope (S-9220, manufactured by Hitachi, Ltd.). The sensitivity was defined as an irradiation energy ($\mu C/cm^2$) at which a line and a space could be separated and resolved from each other at a ratio of 1:1 in the line width of 20 nm.

[Resolving Performance]

The state of 20 nm to 15 nm resolution was observed by means of a scanning electron microscope (S-9220, manufactured by Hitachi, Ltd.), and the results are shown in Table 4. The resolution attained without any problem was denoted by A, and the other states of resolution were denoted by B and C according to the following criteria, with a comment being appropriately noted. The smaller the size of resolved pattern, the higher the resolving performance.

A: Resolved
B: Partially non-resolved (the line width could be measured)
C: Non-resolved (measurement of the line width was difficult)

[Pattern Shape]

The pattern shape having a line width of 20 nm at an irradiation dose exhibiting the sensitivity was observed by means of a scanning electron microscope (S-4800, manufactured by Hitachi, Ltd.). The pattern shape close to a rectangle was denoted by A, and the other shapes were denoted by B and C according to the following criteria, with a comment on the shapes being appropriately noted.
A: Rectangle
B Shape being slightly deteriorated
C: Shape being remarkably deteriorated

TABLE 4

|  | Sensitivity | Resolving performance | | | | | Pattern shape |
|---|---|---|---|---|---|---|---|
|  | µC/cm$^2$ | 20 nm | 18.75 nm | 17.5 nm | 16.25 nm | 15 nm | 20 nm |
| Example 1 | 110 | A | B<br>Partial collapse | C<br>Collapse | C | C | B<br>Surface being slightly roughened |
| Example 2 | 105 | A | A | A | B<br>Partial collapse | C<br>Collapse | A |
| Example 3 | 110 | A | A | A | B<br>Partial collapse | C<br>Collapse | A |
| Example 4 | 95 | A | A | B<br>Partial collapse | C<br>Collapse | C | B<br>Surface being slightly roughened |
| Example 5 | 100 | A | A | A | B<br>Partial collapse | C<br>Collapse | A |
| Example 6 | 100 | A | A | A | B<br>Partial collapse | C<br>Collapse | A |
| Example 7 | 100 | A | A | A | B<br>Partial collapse | C<br>Collapse | A |
| Example 8 | 100 | A | A | A | C<br>Collapse | C | A |
| Example 9 | 100 | A | A | B<br>Partial collapse | C<br>Collapse | C | B<br>Surface being slightly roughened |
| Example 10 | 120 | A | A | B<br>Partial collapse | C<br>Collapse | C | B<br>Surface being slightly roughened |
| Comparative Example 1 | 180 | C<br>Distorted | C | C | C | C | C<br>Film being highly thinned |
| Comparative Example 2 | 150 | B<br>Collapse | C<br>Collapse | C | C | C | C<br>Film being highly thinned |
| Comparative Example 3 | 180 | C<br>Distorted | C | C | C | C | C<br>Film being highly thinned |

As clarified from the results shown in Table 4, Examples 1 to 10 using the developers of S-3 to S-5 were excellent in the sensitivity, the resolving performance, and the pattern shape, as compared with Comparative Examples 1 to 3 using the developers of S-1 and S-2.

Furthermore, in comparison between Example 1 and Example 8, Example 8 using the developer of S-4 (butyl butanoate) was excellent in the sensitivity, the resolving performance, and the pattern shape, as compared with Example 1 using the developer of S-3 (hexyl acetate).

Similarly, in comparison between Example 3 and Example 10, Example 3 using the developer of S-4 (butyl butanoate) was excellent in the resolving performance and the pattern shape, as compared with Example 10 using the developer of S-3 (hexyl acetate).

In addition, in comparison between Example 1 and Example 9, Example 9 including rinsing with the rinsing liquid of S-8 was excellent in the sensitivity and the resolving performance, as compared with Example 1 not including rinsing.

<Evaluation of EUV Exposure>

Examples 11 and 12, and Comparative Example 4

A resist pattern was formed by the following procedure, using the resist composition 1 described in Table 2. The details for forming the resist pattern are shown in Table 5.

[Coating and Post-Coating Bake of Resist Composition]

The resist composition 1 was coated on a 4-inch silicon wafer which had been subjected to an HMDS treatment, and baked for 60 seconds under the condition of 120° C. to form a resist film having a film thickness of 30 nm.

[Exposure]

The wafer on which the resist film had been formed was exposed with a change in the exposure dose, by means of an EUV exposure device to form a 20 nm line-and-space pattern.

[Post-Exposure Bake]

After the irradiation, the film was taken out from the EUV exposure device, and immediately baked under the condition of 110° C. for 60 seconds.

[Development]

By means of a shower type developing device (ADE3000S, manufactured by Actes Kyosan, Inc.), development was carried out by spray-charging the developer (23° C.) described in Table 5 at a flow rate of 200 mL/min for a predetermined period of time while rotating the wafer at 50 rotations (rpm).

Thereafter, a rinsing treatment was carried out by spray-charging the rising liquid (23° C.) described in Table 5 at a flow rate of 200 mL/min for a predetermined period of time while rotating the wafer at 50 rotations (rpm).

Finally, the wafer was dried by rotating it at a high speed of 2,500 rotations (rpm) for 60 seconds.

With respect to the following items, evaluation of the resist pattern was carried out. Details of the results are shown in Table 5.

[Sensitivity]

The obtained pattern was observed by means of a scanning electron microscope (S-4800, manufactured by Hitachi, Ltd.). The sensitivity (mJ/cm$^2$) was defined as an irradiation energy at which a line and a space could be separated and resolved from each other at a ratio of 1:1 in the line width of 20 nm.

[Resolving Performance and Pattern Shape]

The resolution state and the pattern shape with a line width of 20 nm at an irradiation dose at which the above sensitivity was exhibited were observed by means of a scanning electron microscope (S-4800, manufactured by Hitachi, Ltd.). Evaluation was carried out under the same criteria as for the resolving performance and the pattern shape in the above EB exposure evaluation.

TABLE 5

| | Developing process | | | Resolving | |
| --- | --- | --- | --- | --- | --- |
| | Developer | Rinsing liquid | Sensitivity mJ/cm² | performance 20 nm | Pattern shape 20 nm |
| Example 11 | S-3 | — | 25 | B | B Surface being slightly roughened |
| Example 12 | S-4 | S-7 | 25 | A | A |
| Comparative Example 4 | S-1 | — | 40 | C | C Non-resolved |

As clarified from the results shown in Table 5, Examples 11 and 12 using the developers of S-3 and S-4 were excellent in the sensitivity, the resolving performance, and the pattern shape, as compared with Comparative Example 4 using the developer of S-1.

What is claimed is:

1. A pattern forming method comprising, in this order:
   forming a film on a substrate, using an active-light-sensitive or radiation-sensitive resin composition containing a resin (A) which has a repeating unit having a phenolic hydroxyl group, and a repeating unit having a group that decomposes by the action of an acid to generate a carboxyl group, and a compound (B) that generates an acid upon irradiation with active light or radiation;
   exposing the film; and
   developing the exposed film using a developer including an organic solvent, wherein the developer including an organic solvent contains an ester-based organic solvent having 8 or more carbon atoms and 2 or less heteroatoms in the amount of 50% by mass or more, and the ester-based organic solvent contained in the developer does not have an aromatic ring group.

2. The pattern forming method according to claim 1, wherein the repeating unit having a phenolic hydroxyl group is a repeating unit represented by the following General Formula (p1),

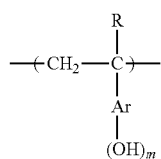

(p1)

in General Formula (p1), R represents a hydrogen atom, a halogen atom, or a linear or branched alkyl group having 1 to 4 carbon atoms, Ar represents an aromatic ring, and m represents an integer of 1 to 5.

3. The pattern forming method according to claim 1, wherein the developer including an organic solvent is a developer containing an ester-based solvent having a structure represented by the following General Formula (S),

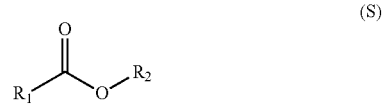

(S)

in General Formula (S), $R_1$ and $R_2$ each independently represent a linear, branched, or cyclic alkyl group, and $R_1$ and $R_2$ satisfy the following relational expression:
$9 \geq$ the number of carbon atoms of $R_1$ + the number of carbon atoms of $R_2 + 1 \geq 8$,
the number of carbon atoms of $R_1 \geq 3$, and
the number of carbon atoms of $R_2 \geq 3$.

4. The pattern forming method according to claim 1, wherein the resin (A) further has a repeating unit having a lactone group.

5. The pattern forming method according to claim 1, wherein the exposure is carried out using electron beams or EUV light.

6. A resist pattern formed by the pattern forming method according to claim 1.

7. A method for manufacturing an electronic device, comprising the pattern forming method according to claim 1.

8. The pattern forming method according to claim 3, wherein the ester-based solvent having the structure represented by General Formula (S) is butyl butanoate, isobutyl butanoate, isobutyl isobutanoate, pentyl butanoate, or butyl pentanoate.

9. The pattern forming method according to claim 3, wherein the developer including an organic solvent contains the ester-based solvent having the structure represented by General Formula (S) in the amount of 85% to 100% by mass.

10. The pattern forming method according to claim 1, wherein the repeating unit having a group that decomposes by the action of an acid to generate a carboxyl group is represented by General Formula (AI):

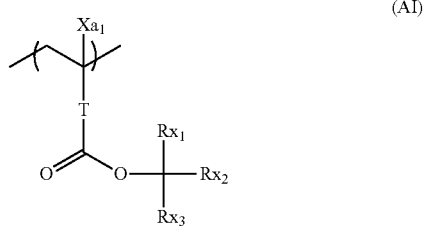

(AI)

wherein in General Formula (AI),
$Xa_1$ represents a hydrogen atom or an alkyl group which may have a substituent,
T represents a single bond or a divalent linking group, and
$Rx_1$ to $Rx_3$ each independently represents a methyl group, an ethyl group, an n-propyl group, an isopropyl group, an n-butyl group, an isobutyl group, a t-butyl group, a cyclopentyl group, a cyclohexyl group, a norbornyl group, a tetracyclodecanyl group, a tetracyclododecanyl group, or an adamantyl group.

11. The pattern forming method according to claim 1, wherein the repeating unit having a group that decomposes by the action of an acid to generate a carboxyl group is represented by General Formula (AI):

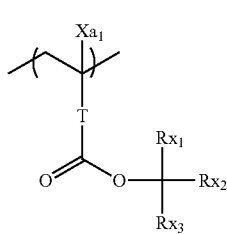

(AI)

wherein in General Formula (AI),
$Xa_1$ represents a hydrogen atom or an alkyl group which may have a substituent,
T represents a single bond or a divalent linking group,
$Rx_1$ represents a methyl group or an ethyl group, and
$Rx_2$ and $Rx_3$ are bonded to each other to form a cycloalkyl group.

12. The pattern forming method according to claim 1, wherein the ester-based organic solvent contained in the developer is at least one organic solvent selected from the group consisting of hexyl acetate, heptyl acetate, octyl acetate, pentyl propionate, hexyl propionate, heptyl propionate, butyl butanoate, pentyl butanoate, hexyl butanoate, propyl pentanoate, butyl pentanoate, pentyl pentanoate, ethyl hexanoate, propyl hexanoate, butyl hexanoate, methyl heptanoate, ethyl heptanoate, propyl heptanoate, cyclohexyl acetate, cycloheptyl acetate, 2-ethylhexyl acetate, cyclopentyl propionate, isobutyl butanoate, isobutyl isobutanoate, isopropyl pentanoate, and isobutyl hexanoate.

13. A pattern forming method comprising, in this order:
forming a film on a substrate, using an active-light-sensitive or radiation-sensitive resin composition containing a resin (A) which has a repeating unit having a phenolic hydroxyl group, and a repeating unit having a group that decomposes by the action of an acid to generate a carboxyl group, and a compound (B) that generates an acid upon irradiation with active light or radiation;
exposing the film; and
developing the exposed film using a developer including an organic solvent,
wherein the developer including an organic solvent contains an ester-based organic solvent having 8 or more carbon atoms and 2 or less heteroatoms in the amount of 50% by mass or more, and
the developer including an organic solvent is a developer containing an ester-based solvent having a structure represented by the following General Formula (S),

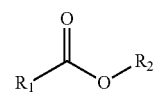

(S)

in General Formula (S), $R_1$ and $R_2$ each independently represent a linear, branched, or cyclic alkyl group, and $R_1$ and $R_2$ satisfy the following relational expression:
$9 \geq$ the number of carbon atoms of $R_1$ + the number of carbon atoms of $R_2 + 1 \geq 8$,
the number of carbon atoms of $R_1 \geq 3$, and
the number of carbon atoms of $R_2 \geq 3$.

* * * * *